(12) United States Patent
Gellrich et al.

(10) Patent No.: US 8,363,206 B2
(45) Date of Patent: Jan. 29, 2013

(54) OPTICAL IMAGING DEVICE WITH THERMAL ATTENUATION

(75) Inventors: Bernhard Gellrich, Aalen (DE); Jens Kugler, Aalen (DE); Thomas Ittner, Aalen (DE); Stefan Hembacher, Bobingen (DE); Karl-Heinz Schimitzek, Oberkochen (DE); Payam Tayebati, Ulm (DE); Hubert Holderer, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 599 days.

(21) Appl. No.: 12/267,074

(22) Filed: Nov. 7, 2008

(65) Prior Publication Data

US 2009/0135385 A1 May 28, 2009

Related U.S. Application Data

(63) Continuation of application No. PCT/EP2007/054503, filed on May 9, 2007.

(30) Foreign Application Priority Data

May 9, 2006 (DE) .......................... 10 2006 021 797

(51) Int. Cl.
*G03B 27/52* (2006.01)
*G03B 27/42* (2006.01)
(52) U.S. Cl. .......................................... 355/30; 355/53
(58) Field of Classification Search .................... 355/53, 355/30
See application file for complete search history.

(56) References Cited

U.S. PATENT DOCUMENTS

| 4,269,067 A | 5/1981 | Tynan et al. |
| 4,346,164 A | 8/1982 | Tabarelli et al. |
| 4,465,368 A | 8/1984 | Matsuura et al. |
| 4,480,910 A | 11/1984 | Takanashi et al. |
| 4,509,852 A | 4/1985 | Tabarelli et al. |

(Continued)

FOREIGN PATENT DOCUMENTS

| DE | 221 563 | 9/1983 |
| DE | 224 448 | 3/1984 |

(Continued)

OTHER PUBLICATIONS

English translation of WO99/49504, published Sep. 30, 1999.

(Continued)

*Primary Examiner* — Peter B Kim
*Assistant Examiner* — Deoram Persaud
(74) *Attorney, Agent, or Firm* — Fish & Richardson P.C.

(57) ABSTRACT

An optical imaging device, in particular for use in microlithography, includes a mask device for receiving a mask having a projection pattern, a projection device with an optical element group, a substrate device for receiving a substrate and an immersion zone. The optical element group is adapted to project the projection pattern onto the substrate and includes a plurality of optical elements with an immersion element to which the substrate is at least temporarily located adjacent to during operation. During operation, the immersion zone is located between the immersion element and the substrate and is at least temporarily filled with an immersion medium. A thermal attenuation device is provided, the thermal attenuation device being adapted to reduce fluctuations within the temperature distribution of the immersion element induced by the immersion medium.

48 Claims, 7 Drawing Sheets

U.S. PATENT DOCUMENTS

| | | |
|---|---|---|
| 4,780,747 A | 10/1988 | Suzuki et al. |
| RE32,795 E | 12/1988 | Matsuura et al. |
| 5,220,171 A | 6/1993 | Hara et al. |
| 5,528,118 A | 6/1996 | Lee |
| 5,610,683 A | 3/1997 | Takahashi |
| 5,623,853 A | 4/1997 | Novak et al. |
| 5,715,039 A | 2/1998 | Fukuda et al. |
| 5,738,165 A | 4/1998 | Imai |
| 5,825,043 A | 10/1998 | Suwa |
| 5,850,280 A | 12/1998 | Ohtomo et al. |
| 5,864,386 A | 1/1999 | Nei |
| 5,874,820 A | 2/1999 | Lee |
| 5,969,441 A | 10/1999 | Loopstra et al. |
| 5,997,963 A | 12/1999 | Davison et al. |
| RE36,730 E | 6/2000 | Nishi |
| 6,191,429 B1 | 2/2001 | Suwa |
| 6,228,544 B1 | 5/2001 | Ota |
| 6,341,007 B1 | 1/2002 | Nishi et al. |
| 6,483,569 B2 | 11/2002 | Ota |
| 6,590,634 B1 | 7/2003 | Nishi et al. |
| 6,611,316 B2 | 8/2003 | Sewell |
| 6,650,399 B2 | 11/2003 | Baselmans et al. |
| 6,721,034 B1 | 4/2004 | Horikawa |
| 6,721,039 B2 | 4/2004 | Ozawa |
| 6,778,257 B2 | 8/2004 | Bleeker et al. |
| 6,819,414 B1 | 11/2004 | Takeuchi |
| 6,897,963 B1 | 5/2005 | Taniguchi et al. |
| 7,180,572 B2 | 2/2007 | Shih et al. |
| 7,227,616 B2 | 6/2007 | Graeupner |
| 7,397,532 B2 * | 7/2008 | Novak ............................ 355/30 |
| 7,679,806 B2 * | 3/2010 | Wehrhan et al. ............... 359/256 |
| 2001/0043314 A1 | 11/2001 | Ota |
| 2002/0001088 A1 | 1/2002 | Wegmann et al. |
| 2002/0018189 A1 | 2/2002 | Mulkens et al. |
| 2002/0041377 A1 | 4/2002 | Hagiwara et al. |
| 2002/0061469 A1 | 5/2002 | Tanaka |
| 2002/0063856 A1 | 5/2002 | Inoue |
| 2002/0163629 A1 | 11/2002 | Switkes et al. |
| 2003/0030916 A1 | 2/2003 | Suenaga |
| 2003/0174408 A1 | 9/2003 | Rostalski et al. |
| 2003/0226951 A1 | 12/2003 | Ye et al. |
| 2004/0000627 A1 | 1/2004 | Schuster |
| 2004/0075895 A1 | 4/2004 | Lin |
| 2004/0109237 A1 | 6/2004 | Epple et al. |
| 2004/0114117 A1 | 6/2004 | Bleeker |
| 2004/0118184 A1 | 6/2004 | Violette |
| 2004/0119954 A1 | 6/2004 | Kawashima et al. |
| 2004/0125351 A1 | 7/2004 | Krautschik |
| 2004/0136494 A1 | 7/2004 | Lof et al. |
| 2004/0160582 A1 | 8/2004 | Lof et al. |
| 2004/0165159 A1 | 8/2004 | Lof et al. |
| 2004/0169834 A1 | 9/2004 | Richter et al. |
| 2004/0169924 A1 | 9/2004 | Flagello et al. |
| 2004/0180294 A1 | 9/2004 | Baba-Ali et al. |
| 2004/0180299 A1 | 9/2004 | Rolland et al. |
| 2004/0207824 A1 | 10/2004 | Lof et al. |
| 2004/0211920 A1 | 10/2004 | Derksen et al. |
| 2004/0224265 A1 | 11/2004 | Endo et al. |
| 2004/0224525 A1 | 11/2004 | Endo et al. |
| 2004/0227923 A1 | 11/2004 | Flagello et al. |
| 2004/0253547 A1 | 12/2004 | Endo et al. |
| 2004/0253548 A1 | 12/2004 | Endo et al. |
| 2004/0257544 A1 | 12/2004 | Vogel et al. |
| 2004/0259008 A1 | 12/2004 | Endo et al. |
| 2004/0259040 A1 | 12/2004 | Endo et al. |
| 2004/0263808 A1 | 12/2004 | Sewell |
| 2005/0030506 A1 | 2/2005 | Schuster |
| 2005/0036121 A1 | 2/2005 | Hoogendam et al. |
| 2005/0036183 A1 | 2/2005 | Yeo et al. |
| 2005/0036184 A1 | 2/2005 | Yeo et al. |
| 2005/0036213 A1 | 2/2005 | Mann et al. |
| 2005/0037269 A1 | 2/2005 | Levinson |
| 2005/0042554 A1 | 2/2005 | Dierichs et al. |
| 2005/0046813 A1 | 3/2005 | Streefkerk et al. |
| 2005/0046934 A1 | 3/2005 | Ho et al. |
| 2005/0048223 A1 | 3/2005 | Pawloski et al. |
| 2005/0068499 A1 | 3/2005 | Dodoc et al. |
| 2005/0068639 A1 | 3/2005 | Pierrat et al. |
| 2005/0073670 A1 | 4/2005 | Carroll |
| 2005/0084794 A1 | 4/2005 | Meagley et al. |
| 2005/0094116 A1 | 5/2005 | Flagello et al. |
| 2005/0094125 A1 | 5/2005 | Arai |
| 2005/0100745 A1 | 5/2005 | Lin et al. |
| 2005/0110973 A1 | 5/2005 | Streefkerk et al. |
| 2005/0117224 A1 | 6/2005 | Shafer et al. |
| 2005/0122490 A1 * | 6/2005 | Luttikhuis et al. .............. 355/30 |
| 2005/0122497 A1 | 6/2005 | Lyons et al. |
| 2005/0132914 A1 | 6/2005 | Mulkens et al. |
| 2005/0134815 A1 | 6/2005 | Van Santen et al. |
| 2005/0141098 A1 | 6/2005 | Schuster |
| 2005/0145803 A1 | 7/2005 | Hakey et al. |
| 2005/0146694 A1 | 7/2005 | Tokita |
| 2005/0146695 A1 | 7/2005 | Kawakami |
| 2005/0147920 A1 | 7/2005 | Lin et al. |
| 2005/0153424 A1 | 7/2005 | Coon |
| 2005/0158673 A1 | 7/2005 | Hakey et al. |
| 2005/0164502 A1 | 7/2005 | Deng et al. |
| 2005/0174549 A1 | 8/2005 | Duineveld et al. |
| 2005/0175940 A1 | 8/2005 | Dierichs |
| 2005/0179877 A1 | 8/2005 | Mulkens et al. |
| 2005/0185269 A1 | 8/2005 | Epple et al. |
| 2005/0190435 A1 | 9/2005 | Shafer et al. |
| 2005/0190455 A1 | 9/2005 | Rostalski et al. |
| 2005/0205108 A1 | 9/2005 | Chang et al. |
| 2005/0217135 A1 | 10/2005 | O'Donnell et al. |
| 2005/0217137 A1 | 10/2005 | Smith et al. |
| 2005/0217703 A1 | 10/2005 | O'Donnell |
| 2005/0225737 A1 | 10/2005 | Weissenrieder et al. |
| 2005/0243328 A1 | 11/2005 | Wegmann et al. |
| 2005/0264780 A1 | 12/2005 | Graeupner |
| 2005/0270505 A1 | 12/2005 | Smith |
| 2006/0001851 A1 | 1/2006 | Grant et al. |
| 2006/0007415 A1 | 1/2006 | Kosugi et al. |
| 2006/0033892 A1 | 2/2006 | Cadee et al. |
| 2006/0061747 A1 | 3/2006 | Ishii |
| 2006/0066926 A1 | 3/2006 | Kwak et al. |
| 2006/0082744 A1 | 4/2006 | Hirukawa |
| 2006/0092533 A1 | 5/2006 | Sogard |
| 2006/0139589 A1 * | 6/2006 | Uitterdijk et al. ............... 355/53 |
| 2006/0187432 A1 | 8/2006 | Yasuda et al. |
| 2006/0268249 A1 | 11/2006 | Kameyama |
| 2006/0291060 A1 * | 12/2006 | Shirai et al. .................... 359/582 |
| 2007/0070316 A1 | 3/2007 | Ehrmann et al. |
| 2007/0210118 A1 * | 9/2007 | Gadini .......................... 222/361 |
| 2008/0106707 A1 | 5/2008 | Kobayashi et al. |
| 2008/0309894 A1 | 12/2008 | Ehrmann et al. |
| 2009/0115977 A1 | 5/2009 | Nagasaka et al. |
| 2010/0141912 A1 | 6/2010 | Ehrmann |

FOREIGN PATENT DOCUMENTS

| | | |
|---|---|---|
| DE | 101 09 929 | 11/2001 |
| DE | 103 01 799 | 4/2004 |
| DE | 102 61 775 | 7/2004 |
| EP | 0 357 423 | 3/1990 |
| EP | 0 823 662 | 2/1998 |
| EP | 0 956 871 | 11/1999 |
| EP | 1 041 357 | 10/2000 |
| EP | 1 369 743 | 12/2003 |
| EP | 1 420 298 | 5/2004 |
| EP | 1 477 853 | 11/2004 |
| EP | 1 498 781 | 1/2005 |
| EP | 1 524 558 | 4/2005 |
| EP | 1 531 364 | 5/2005 |
| EP | 1 624 481 | 2/2006 |
| EP | 1 628 330 | 2/2006 |
| EP | 1 672 680 | 6/2006 |
| EP | 1 677 341 | 7/2006 |
| EP | 1 713 115 | 10/2006 |
| EP | 1 843 384 | 10/2007 |
| JP | 57-117238 | 7/1982 |
| JP | 57-152129 | 9/1982 |
| JP | 57-153433 | 9/1982 |
| JP | 58-202448 | 11/1983 |
| JP | 59-019912 | 2/1984 |
| JP | 62-065326 | 3/1987 |
| JP | 63-157419 | 6/1988 |
| JP | 3-3222 | 1/1991 |

| | | |
|---|---|---|
| JP | 04-305915 | 10/1992 |
| JP | 04-305917 | 10/1992 |
| JP | 05-021314 | 1/1993 |
| JP | 05-062877 | 3/1993 |
| JP | 06-029204 | 2/1994 |
| JP | 06-124873 | 5/1994 |
| JP | 07-220990 | 8/1995 |
| JP | 08-130179 | 5/1996 |
| JP | 08-316125 | 11/1996 |
| JP | 08-330224 | 12/1996 |
| JP | 09-232213 | 9/1997 |
| JP | 10-154659 | 6/1998 |
| JP | 10-163099 | 6/1998 |
| JP | 10-214783 | 8/1998 |
| JP | 10-255319 | 9/1998 |
| JP | 10-303114 | 11/1998 |
| JP | 10-340846 | 12/1998 |
| JP | 11-016816 | 1/1999 |
| JP | 11-135400 | 5/1999 |
| JP | 11-176727 | 7/1999 |
| JP | 2000-058436 | 2/2000 |
| JP | 2000-505958 | 5/2000 |
| JP | 2000-164504 | 6/2000 |
| JP | 2001-510577 | 7/2001 |
| JP | 2001-267239 | 9/2001 |
| JP | 2002-005586 | 1/2002 |
| JP | 2002-014005 | 1/2002 |
| JP | 2002-071514 | 3/2002 |
| JP | 2002-198303 | 7/2002 |
| JP | 2002-231622 | 8/2002 |
| JP | 2004-519850 | 7/2004 |
| JP | 2005-012201 | 1/2005 |
| JP | 2005-051231 | 2/2005 |
| JP | 2005-136404 | 5/2005 |
| JP | 2006-024915 | 1/2006 |
| JP | 2006-165500 | 6/2006 |
| KR | 10-2004-0044119 | 5/2004 |
| WO | WO 99/60361 | 1/1999 |
| WO | WO 99/23692 | 5/1999 |
| WO | WO 99/28790 | 6/1999 |
| WO | WO 99/49504 A1 | 9/1999 |
| WO | WO 01/35168 | 5/2001 |
| WO | WO 02/091078 A1 | 11/2002 |
| WO | WO 03/077037 A1 | 9/2003 |
| WO | WO 03/079418 | 9/2003 |
| WO | WO 2004/019128 | 3/2004 |
| WO | WO 2004/053596 | 6/2004 |
| WO | WO 2005/050324 A2 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/077154 A2 | 9/2004 |
| WO | WO 2004/081666 A1 | 9/2004 |
| WO | WO 2004/090577 A2 | 10/2004 |
| WO | WO 2004/090633 A2 | 10/2004 |
| WO | WO 2004/090634 A2 | 10/2004 |
| WO | WO 2004/092830 A2 | 10/2004 |
| WO | WO 2004/093130 A2 | 10/2004 |
| WO | WO 2004/093159 A2 | 10/2004 |
| WO | WO 2004/093160 A2 | 10/2004 |
| WO | WO 2004/095135 A2 | 11/2004 |
| WO | WO 2004/107417 | 12/2004 |
| WO | WO 2005/001432 A2 | 1/2005 |
| WO | WO 2005/003864 A2 | 1/2005 |
| WO | WO 2005/006026 A2 | 1/2005 |
| WO | WO 2005/008339 A2 | 1/2005 |
| WO | WO 2005/013008 A2 | 2/2005 |
| WO | WO 2005/015283 A2 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/024325 A2 | 3/2005 |
| WO | WO 2005/024517 A2 | 3/2005 |
| WO | WO 2005/029559 | 3/2005 |
| WO | WO 2005/034174 A2 | 4/2005 |
| WO | WO 2005/038888 | 4/2005 |
| WO | WO 2005/054953 A2 | 6/2005 |
| WO | WO 2005/054955 A2 | 6/2005 |
| WO | WO 2005/059617 A2 | 6/2005 |
| WO | WO 2005/059618 A2 | 6/2005 |
| WO | WO 2005/059645 A2 | 6/2005 |
| WO | WO 2005/059654 A2 | 6/2005 |
| WO | WO 2005/062128 A2 | 7/2005 |
| WO | WO 2005/064400 A2 | 7/2005 |
| WO | WO 2005/064405 A2 | 7/2005 |
| WO | WO 2005/069055 A2 | 7/2005 |
| WO | WO 2005/069078 A1 | 7/2005 |
| WO | WO 2005/069081 A2 | 7/2005 |
| WO | WO 2005/071491 | 8/2005 |
| WO | WO 2005/074606 A2 | 8/2005 |
| WO | WO 2005/076084 A1 | 8/2005 |
| WO | WO 2005/076324 | 8/2005 |
| WO | WO 2005/081030 A1 | 9/2005 |
| WO | WO 2005/081067 A1 | 9/2005 |
| WO | WO 2005/106589 | 11/2005 |
| WO | WO 2006/051689 | 5/2006 |
| WO | WO 2006/059636 | 6/2006 |
| WO | WO 2006/080212 | 8/2006 |
| WO | WO 2006/121008 | 11/2006 |
| WO | WO 2006/126522 | 11/2006 |

OTHER PUBLICATIONS

English machine translation of Japanese Publication No. 2005-051231, dated Aug. 2, 2006.
B.J. Lin, "Semiconductor Foundry, Lithography, and Partners", Emerging Lithographic Technologies VI, Proceedings of SPIE, vol. 4688 (2002), pp. 11-24.
M. Switkes et al., "Resolution Enhancement of 157 nm Lithography by Liquid Immersion," Optical Microlithography XV, Proceedings of SPIE, vol. 4691 (2002), pp. 459-465.
M. Switkes et al., "Resolution Enhancement of 157 nm Lithography by Liquid Immersion," J. Microlith., Microfab., vol. 1, No. 3, Oct. 2002, Society of Photo-Optical Instrumentation Engineers, pp. 225-228.
Soichi Owa et al., "Nikon F2 Exposure Tool," Nikon Corporation, 3$^{rd}$ 157 nm symposium, Sep. 4, 2002, 25 pages (slides 1-25).
Immersion Lithography Workshop, Nikon Corporation, Dec. 11, 2002, 24 pages (slides 1-24).
Soichi Owa et al., "Immersion lithography; its potential performance and issues," Optical Microlithography XVI, Proceedings of SPIE vol. 5040 (2003), pp. 724-733.
Soichi Owa et al., "Update on 193 nm immersion exposure tool," Nikon Corporation, Immersion Workshop, Jan. 27, 2004, 38 pages (slides 1-38).
Soichi Owa et al., "Update on 193 nm immersion exposure tool," Nikon Corporation, Litho Forum, Jan. 28, 2004, 51 pages (slides 1-51).
Soichi Owa et al., "Potential performance and feasibility of immersion lithography," Nikon Corporation, NGL Workshop, Jul. 10, 2003, 33 pages (slides 1-33).
Masaomi Kameyama, "Present Status of Immersion Lithography," Technology Symposium, SEMI (Semiconductor Equipment and Materials International), Dec. 4, 2003.
Masaomi Kameyama, "Immersion Lithography and NGL," The Society of Polymer Science, Japan, Jan. 20, 204.

* cited by examiner

OPTICAL IMAGING DEVICE WITH THERMAL ATTENUATION

CROSS-REFERENCE TO RELATED APPLICATIONS

This application is a continuation application of and claims priority to International Application No. PCT/EP2007/054503, filed on May 9, 2007, which claims priority to German Application No. 10 2006 021 797.7, filed May 9, 2006. The entire contents of Internation application PCT/EP2007/054503 are incorporated herein by reference.

FIELD OF THE DISCLOSURE

The present disclosure relates to an optical imaging device. Disclosed embodiments may be used in the context of microlithography used in fabricating microelectronic circuits. The disclosure further relates to an optical imaging method which may, among others, be performed with the optical imaging device.

BACKGROUND

In microlithography it is generally desirable to keep the position and the geometry of the components (e.g., the optical elements such as lenses, mirrors and gratings) of an imaging device unchanged during operation to the highest possible extent in order to achieve a correspondingly high imaging quality. The tough requirements with respect to accuracy lying in a microscopic range in the area of a few nanometers are none the less a consequence of the permanent need to reduce the resolution of the optical systems used in fabricating microelectronic circuitry in order to push forward miniaturization of the microelectronic circuitry to be produced.

In order to achieve an increased resolution either the wavelength of light used may be reduced as it is the case with systems working in the extreme ultraviolet (EUV) range at working wavelengths in the area of 13 nm or the numerical aperture of the projection system used may be increased. One possibility to remarkably increase the numerical aperture above the value 1 is realized in so-called immersion systems, wherein an immersion medium having a refractive index larger than 1 is placed between an immersion element of the projection system and the substrate to be exposed. A further increase in the numerical aperture is possible with optical elements having a particularly high refractive index.

In a so-called single immersion system, the immersion element (i.e. the optical element at least in part contacting the immersion medium in the immersed state) typically is the last optical element located closest to the substrate to be exposed. Here, the immersion medium typically contacts this last optical element and the substrate. In a so-called double immersion system, the immersion element does not necessarily have to be the last optical element, i.e., the optical element located closest to the substrate. In such double or multiple immersion systems, and immersion element may also be separated from the substrate by one or more further optical elements. In this case, the immersion medium the immersion element is at least partly immersed in may be placed, for example, between two optical elements of the optical system.

With the reduction of the working wavelength as well as with the increase of the numerical aperture not only the requirements with respect to the positioning accuracy and the dimensional accuracy of the optical elements used become more strict throughout the entire operation. Of course, the requirements with respect to the minimization of imaging errors of the entire optical arrangement increase as well.

The temperature distribution within the optical elements used and the deformation of the respective optical element eventually resulting from the temperature distribution as well as an eventual temperature related variation of the refractive index of the respective optical element can be important in this context.

Various approaches taken to actively counteract heating of a mirror (e.g., in an EUV system) resulting from the incident light and to keep a temperature captured at a given location within the mirror actively within given limits. For example, one can use a temperature adjustment device located centrally on the backside of a mirror including Peltier elements or the like to provide targeted cooling. This solution, on the one hand, can have the disadvantage that it is not suitable for use with refractive optical elements as they are used in particular with the immersion systems mentioned above since the central temperature adjustment device would then cover the area optically used. On the other hand, only the temperature of a single location within the mirror is generally reliably controlled in a more or less stationary state considering the light energy absorbed by the mirror. Further thermal influences of the environment, in particular non-stationary and/or locally varying thermal influences as they may be introduced by an immersion medium and as they may cause dynamic and local fluctuations in the temperature distribution within the mirror, respectively, remain unconsidered. See, e.g., EP 1 477 853 A2 (to Sakamoto), the entire disclosure of which is incorporated herein by reference.

SUMMARY

In general, in one aspect, the disclosure features an optical imaging device as well as an optical imaging method not showing these disadvantages or at least showing them to a lesser degree and, in particular, allows in a simple manner compensation of local thermal environmental influences to the optical element besides the consideration of absorption effects of the projection light.

It is believed that such thermal environmental influences, in particular, influences originating from the immersion medium, in an immersion system may cause local fluctuations within the temperature distribution of the respective optical elements that are not negligible or even considerable in relation to the absorption effects of the projection light. Accordingly, it is believed that the desired compensation of such thermal environmental influences can also be possible with refractive systems and refractive optical elements, respectively, as they are used with immersion systems if a corresponding thermal attenuation is available reducing, besides the absorption related fluctuations, also fluctuations in the temperature distribution of the respective optical element induced by the environment of the respective optical element. To this end, with a variant with an immersion system, a thermal attenuation device can be provided for an immersion element, the thermal attenuation device being adapted to provide a reduction of fluctuations in the temperature distribution of the immersion element induced by the immersion medium. It is possible, besides accounting for absorption effects, to account for the local fluctuations within the temperature distribution of the immersion element in induced, among others, by the immersion medium.

In some embodiments, in particular for refractive elements, a corresponding temperature behavior model, in particular accounting for non-stationary and/or local environmental influences, may be set up and used in an active control of the temperature distribution. With such a temperature behavior model, one can predict or estimate the temperature distribution which is, if at all, only hardly to the measured in the optically used area without disturbance to the imaging process, and to account for this predicted or estimated temperature distribution in the control of the temperature distribution.

In a further aspect, the disclosure features an optical imaging device, in particular for use in microlithography, including a mask device for receiving a mask comprising a projection pattern, a projection device with an optical element group, a substrate device for receiving a substrate and an immersion zone. The optical element group is adapted to project the projection pattern onto the substrate and includes a plurality of optical elements with an immersion element to which the substrate is at least temporarily located adjacent to during operation. During operation, the immersion zone is located between the immersion element and the substrate and is at least temporarily filled with an immersion medium. A thermal attenuation device is provided, the thermal attenuation device being adapted to reduce fluctuations within the temperature distribution TE of the immersion element induced by the immersion medium.

In another aspect, the disclosure features an optical imaging method, in particular for use in microlithography, wherein a projection pattern is projected onto a substrate using the optical elements of an optical element group, an immersion element of the optical element group being at least partly immersed in an immersion medium in the area of an immersion zone located adjacent to the substrate. According to the disclosure, via a thermal attenuation device, fluctuations in the temperature distribution TE of the immersion element induced by the immersion medium are reduced.

In another aspect, the disclosure features an optical imaging device, in particular for microlithography, comprising a mask device for receiving a mask comprising a projection pattern, a projection device with an optical element group, a substrate device for receiving a substrate and an immersion zone, wherein the optical element group is adapted to project the projection pattern onto the substrate. The optical element group includes a plurality of optical elements with at least one immersion element at least temporarily immersed in an immersion medium in the area of an immersion zone during operation. There is provided a thermal attenuation device adapted to reduce fluctuations within the temperature distribution TE of the immersion element induced by the immersion medium, wherein the thermal attenuation device includes at least one thermal decoupling device for at least partial thermal decoupling of the immersion element from at least a part of its environment.

In another aspect, the disclosure features an optical imaging method, in particular for use in microlithography, wherein a projection pattern is projected onto a substrate using the optical elements of an optical element group, an immersion element of the optical element group being at least partly immersed in an immersion medium in the area of an immersion zone. According to the disclosure, via a thermal attenuation device, fluctuations in the temperature distribution TE of the immersion element induced by the immersion medium are reduced, wherein by the thermal attenuation device that at least partial thermal decoupling of the immersion element from at least a part of its environment is provided.

In a further aspect, the disclosure features an optical imaging device, in particular for use in microlithography, comprising a mask device for receiving a mask comprising a projection pattern, a projection device with an optical element group, a substrate device for receiving a substrate. The optical element group is adapted to project the projection pattern onto the substrate and includes a plurality of optical elements with at least one thermally controlled optical element. According to the disclosure a thermal attenuation device is associated to the thermally controlled optical element, the thermal attenuation device being adapted to reduce fluctuations within the temperature distribution TE of the thermally controlled optical element, wherein the thermal attenuation device, for reducing temperature fluctuations within the thermally controlled optical element, accesses a temperature behavior model of the thermally controlled optical element.

In another aspect, the disclosure features an optical imaging method, in particular for use in microlithography, wherein a projection pattern is projected onto a substrate using the optical elements of an optical element group, the optical elements comprising a thermally controlled optical element. According to the disclosure, via a thermal attenuation device, fluctuations within the temperature distribution TE of the thermally controlled optical element are reduced, wherein for reducing the temperature fluctuations within the thermally controlled optical element a temperature behavior model of the thermally controlled optical element is accessed.

The details of one or more embodiments of the invention are set forth in the accompanying drawings and the description below. Other features and advantages will be apparent from the description, drawings, and claims.

DETAILED DESCRIPTION

In the following, an embodiment of the optical imaging device for use in a microlithography process will be described with reference to FIGS. 1 to 9.

Figure 1:
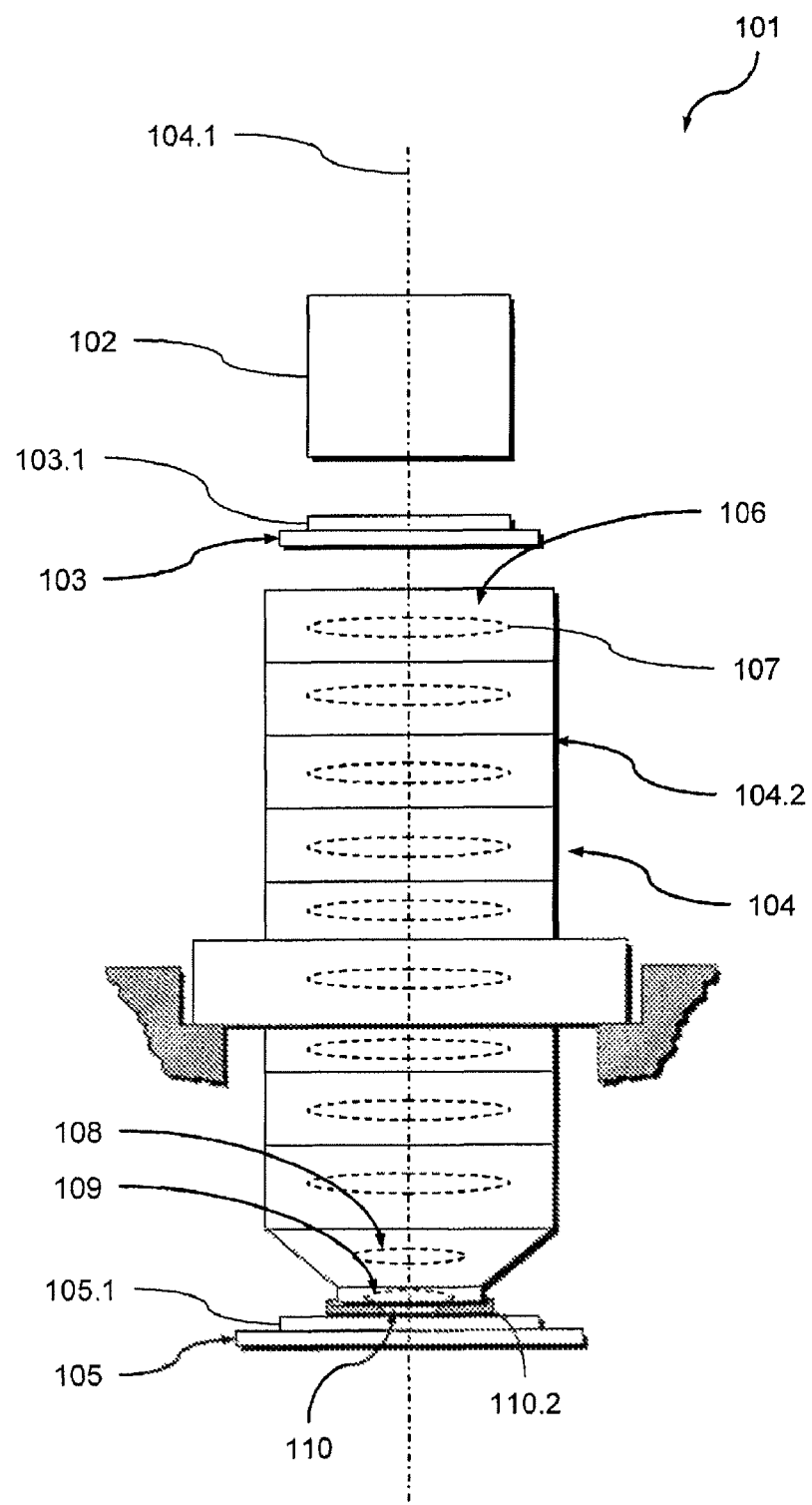
FIG. 1 is a schematic representation of an embodiment of an optical imaging device according to the disclosure with which an embodiment of an optical imaging method.

FIG. 1 shows a schematic representation of an embodiment of the optical imaging device in the form of a microlithography device 101 operating with light in the UV range at a wavelength of 193 nm.

The microlithography device 101 includes an illumination system 102, a mask device in the form of a mask table 103, and optical projection system in the form of an objective 104 having an optical axis 104.1 and a substrate device in the form of a wafer table 105. The illumination system 102 illuminates a mask 103.1 arranged on the mask table 103 with a projection light beam—not shown in further detail—having a wavelength of 193 nm. A projection pattern is formed on the mask 104.3 which is projected with the projection light beam via the optical elements arranged within the objective 104 onto a substrate in the form of a wafer 105.1 arranged on the wafer table 105.

The objective 104 includes an optical element group 106 formed by a gay series of optical elements 107 to 109. The optical elements 107 to 109 are held within the housing 104.2 of the objective. Due to the working wavelength of 193 nm the optical elements 107 to 109 are refractive optical elements such as lenses or the like. Thereby, the last optical element 109 located closest to the wafer 105.1 during operation is a so called closing element or last lens element.

The microlithography device 101 is an immersion system. In an immersion zone 110, a liquid immersion medium 110.1, for example highly purified water or the like, is arranged between the wafer 105.1 and the last lens element 109. Within the immersion zone 110 there is provided an immersion bath of the immersion medium 110.1 on the one hand downwardly delimited at least by the part of the wafer 105.1 to be actually exposed. The lateral limitation on the immersion bath is provided at least partially by an immersion frame 110.2 (typically also called an immersion hood). At least the part of the last lens element 109 optically used during exposure and the part of the last lens element 109 lying on the outer side of the objective 104 is immersed in the immersion bath such that the last lens element 109 is an immersion element. Thus, the path of exiting from the last lens element 109 between the last lens element 109 and the wafer is located exclusively within the immersion medium 110.

Due to the refractive index of the immersion medium lying above the value 1 a numerical aperture NA>1 is achieved and the resolution is enhanced with respect to a conventional system with a gas atmosphere between the last lens element and the wafer.

In order to achieve a numerical aperture with a value NA>1.4 a material can be used for last lens element 109 that has a refractive index above the refractive index of quartz (SiO) or calcium fluoride (CaF) typically used for such lens elements. In the present embodiment the material of the last lens element 109 is a spinel. However, in some embodiments, other lens materials having a correspondingly high refractive index and being suitable for the respective wavelength may be used. An example for such a lens material is LuAG (Lutetium aluminum garnet, for example $Lu_3Al_5O_{12}$). Furthermore, conventional quartz or calcium fluoride lenses can be used. Furthermore, other numerical apertures may be selected. With respect to a high resolution, however, the numerical aperture can have a value of at least 1.3.

The spinel used for the last lens element 109 is a considerably higher temperature sensitivity of the refractive index than conventional quartz or calcium fluoride lenses. Thus, it is necessary to keep the actual temperature distribution TE within the last lens element within narrow variation limits during operation in order to maintain a given setpoint temperature distribution TSE in order to at least reduce (e.g., minimize) imaging errors resulting from corresponding variations in the refractive index of the last lens element 109.

It will be appreciated however that, in particular in the area of microlithography, with systems having optical elements made from quartz (SiO) or calcium fluoride (CaF), variations or fluctuations in the temperature distribution of the immersion elements may occur that are not negligible any more such that, for such systems as well, using the disclosed techniques for thermal attenuation can be of great advantage.

Figure 2:
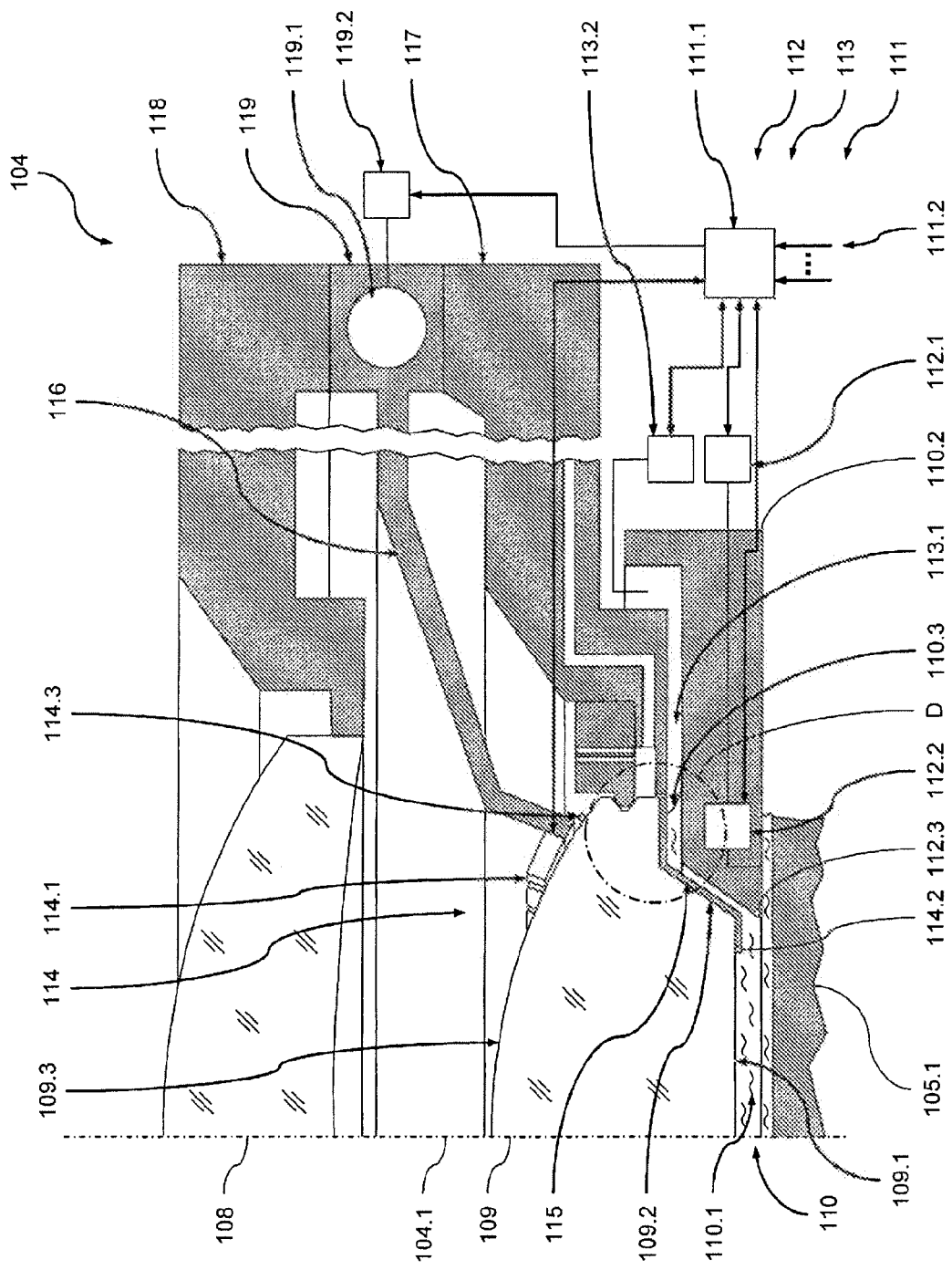
FIG. 2 is a schematic partially sectional view of a part of the imaging device of FIG. 1.

In order to meet these narrow variation limits around a given setpoint temperature distribution TSE, a thermal attenuation device 111 is provided. In the following the thermal attenuation device 111 is described in further detail mainly with reference to the FIGS. 2 to 9. FIG. 2 shows—partially in a highly schematic manner—a half-section of the wafer side end of the objective 104.

In the present example, thanks to the thermal attenuation device 110, a maximum deviation $\Delta TE=1$ mK from a given setpoint temperature distribution TSE of the last lens element 109 is achieved during operation of the microlithography device 101. the imaging errors and imaging error variations, respectively, resulting from family induced deformation and thermally induced refractive index alterations may be kept sufficiently low in order to achieve a high imaging quality. However, it will be appreciated that, with other variants of the disclosure, other, eventually higher maximum deviations are possible, in particular depending on the thermal deformation behavior and the thermal refractive index variation of the material used. In some embodiments, these maximum deviations do not exceed 10 mK since then a particularly high imaging quality may be achieved.

It will be appreciated in this context that the given setpoint temperature distribution TSE may be arbitrarily selected. It may be selected such that the last lens element 109 in itself, at least one imaging error type, has a minimized imaging error. However, it may also be selected such that the last lens element 109, at this setpoint temperature distribution TSE, in itself for at least one imaging error type has an imaging error having a sufficient amount to reduce or even fully compensate a corresponding imaging error of the remaining optical elements of the optical element group 106 such that at least one imaging error type the overall imaging error of the objective 104 is minimized. See, e.g., EP 0 956 871 A1 (to Rupp), the entire disclosure of which is incorporated herein by reference.

The thermal attenuation device 111 includes a plurality of active thermal attenuation control circuits as well as passive thermal attenuation components. Among others, it includes as a first thermal attenuation control circuit a control circuit for specific control of the supply temperature of the immersion medium 110.1 to the immersion zone.

To this end, the first thermal attenuation control circuit 112 includes a supply device 112.1, a first temperature adjustment device 112.2, first temperature sensors 112.3 and a control device 111.1. Via at least one supply line the supply device 112.1 provides the immersion medium 110.1 in a sufficient amount and a sufficient flow rate to the immersion zone 110. A first temperature adjustment device 112.2 connected to the control device 111.1 is arranged shortly ahead of the access point of the immersion medium 110.1 to the immersion zone 110 and adjusts the temperature of the immersion medium 110.1 to a desired supply temperature TIF. The first temperature sensors 112.3 are connected to the control device 111.1 via wireless and/or at least partially wire bound connections—not shown for reasons of better visibility.

The desired supply temperature TIF is established by the control device 111.1 the manner described in the following. the first temperature sensors 112.3 being evenly distributed at the circumference of the immersion zone 110 and representing a first establishing device in the sense of the present disclosure the temperature of the immersion medium 110.1 at the circumference of the immersion zone 110 is detected. The first temperature sensors 112.3 provide corresponding first temperature data to associated inputs 111.2 of the control device 111.1.

However, it will be appreciated that, instead of the direct measurement via the first temperature sensors 112.3 evenly distributed at the circumference of the immersion zone 110, a measurement or establishment of a temperature or at least another parameter may be provided at a different location. From this temperature or parameter, in an estimation device, via a corresponding sufficiently accurate estimation—based on a sufficiently accurately known relation between this established parameter and the temperature of the immersion medium 110.1 at the circumference of the immersion zone 110—the temperature of the immersion medium at the circumference of the immersion zone 110 may be estimated.

From these first temperature data the control device 111.1 establishes an actual temperature distribution TI within the immersion zone 110 using a stored first temperature behavior model of the immersion medium 110.1. As further parameters the first temperature behavior model hereby considers the actual supply temperature TIF of the immersion medium (provided to the control device 111.1 by the first temperature adjustment device 112.2), the flow rate of the immersion medium 110.1 (provided to the control device 111.1 by the supply device 112.1), the actual temperature distribution TE of the last lens element 109 (established in a manner described in further detail below) and the actual light power (provided to the control device by the illumination device 102).

From the actual temperature distribution TI, depending on a given setpoint temperature distribution TSI within the immersion medium 110.1, the control device 111.1 establishes a first control value C for the temperature adjustment device 112.2 and/or the supply device 112.1. Using this first control value C the temperature adjustment device performs the adjustment of the supply temperature TIF and/or the supply device 112.1 performs adjustment of the flow rate in such a manner that the actual temperature distribution TI approaches the setpoint temperature distribution TSI within the immersion medium 110.

Establishment of the supply temperature TIF may be performed as a function of an alteration ΔTIE within the actual temperature distribution TI that is to be expected from the temperatures and parameters previously captured or established. In other words, using the temperature behavior model, such an alteration ΔTIE may be anticipated and counteracted prior to its (full) existence.

The actual temperature distribution TI within the immersion medium 110.1 represents a parameter P influencing the temperature of the last lens element 109 since, due to a temperature gradient between the immersion medium 110.1 and the last lens element 109 a heat transfer occurs between the immersion medium 110.1 and the last lens element 109 leading to a temperature alteration in the last lens element 109. Furthermore, the supply temperature TIF and/or the flow rate represent control parameters since they may be used to influence the temperature gradient between the immersion medium 110.1 and the last lens element 109 and the heat transfer between the immersion medium 110.1 and last lens element 109, respectively. Accordingly, the temperature adjustment device 112.2 and/or the supply device 112.1 respectively represent influencing devices.

It will be appreciated in this context that the given setpoint temperature distribution TSI within the immersion medium 110.1 may be selected in an arbitrary manner. It may be set in a static manner such that, in case of an existence of the setpoint temperature distribution TSI within the immersion medium 110.1 and in case of an existence of the setpoint temperature distribution TSE within the last lens element 109, no temperature gradient and, consequently, no heat transfer exists between the last lens element 109 and the immersion medium 110.

In other words, if the last lens element 109 is in its setpoint state in this case, no considerable thermal disturbance is introduced into the last lens element 109 by the immersion medium 110 controlled in this manner. However, if the last lens element 109 in this case is in a state deviating from its setpoint state a temperature gradient results between the last lens element 109 and the immersion medium 110.1 counteracting the actual deviation between the actual temperature distribution TE and the setpoint temperature distribution TSE of the last lens element 109 such that via the immersion medium 110.1 controlled in this manner an attenuation effect is achieved.

The setpoint temperature distribution TSI within the immersion medium 110.1 may also be selected as a function of the actual temperature distribution TE of the last lens element 109 in such a manner that, in case of an existence of the setpoint temperature distribution TSI within the immersion medium 110.1, a given temperature gradient and, thus, a given heat transfer is provided between the last lens element 109 and the immersion medium 110.1. The temperature gradient between the last lens element 109 and the immersion medium 110.1 can be selected in such a manner that it counteracts a deviation of the actual temperature distribution TE of the last lens element 109 from the setpoint temperature distribution TSE of the last lens element 109 such that here as well a thermal attenuation effect is achieved via the immersion medium 110.1 controlled in this manner.

In this case the temperature gradient between the last lens element 109 and the immersion medium 110.1 set via the immersion medium 110.1 can be selected the higher the higher the deviation of the actual temperature distribution TE is from the setpoint temperature distribution TSE of the last lens element 109. In other words, in this manner a dynamic thermal attenuation of deviations between the actual temperature distribution TE and the setpoint temperature distribution TSE of the last lens element 109 may be achieved.

If in this case the last lens element 109 is in its setpoint state the immersion medium 110.1 controlled in this manner does not introduce a considerable thermal disturbance into the last lens element 109. If this is not the case, the counteraction via the immersion medium 110.1 controlled in this manner is the stronger the higher the deviation is between the actual temperature distribution TE and the setpoint temperature distribution TSE of the last lens element 109.

The thermal attenuation device 111 further includes as a second thermal attenuation control circuit a control circuit 113 for a specified control of the temperature TA and/or the humidity HA and/or the flow rate VA of the gas atmosphere 113.1 contacting the free surface 110.3 of the immersion medium 110.1.

The second thermal attenuation control circuit 113, to this end, includes a second supply device 113.2 former gas atmosphere 113.1 and the control device 111.1. The second supply device 113.2, via at least one supply line, provides a gas in a sufficient amount where with corresponding temperature and flow rate at the free surface 110.3 of the immersion medium 110.1. The second supply device 113.2 adjusts the temperature and/or the humidity and/or the flow rate of the gas atmosphere 113.12 desired values established by the control device 111.1 in the manner described in the following.

The control device 111.1 in the manner described above establishes the actual temperature distribution TI within the immersion medium 110.1 within the immersion zone 110. From the actual temperature distribution TI within the immersion medium 110.1 the control device 111.1 then establishes, as a function of a given setpoint temperature distribution TSI within the immersion medium, a second control value C for the second supply device 113.2. Using the second control value C the second supply device 113.2 performs in the adjustment of the temperature and/or the humidity and/or the flow rate of the gas atmosphere 113.1.

In each case, the adjustment may be provided in such a manner that evaporation of the immersion medium at the fray surface 110.3 of the immersion medium 110.1 is minimized. In some embodiments, this happens by adjusting the temperature of the gas atmosphere 113.1 in such a manner that it corresponds to the temperature of the immersion medium 110.1 at the free surface 110.3 and by adjusting the humidity of the gas atmosphere 113.1 to a sufficiently high value (e.g., to a complete saturation) in order to avoid evaporation of the immersion medium 110.1 and, consequently, a heat transfer from the immersion medium 110.1.

In other words, with this variant, it is avoided that via an evaporation of the immersion medium 110.1 at the free surface 110.3 a thermal disturbance is introduced into the immersion medium and, thus, also into the last lens element 109.

The control via the second thermal attenuation control circuit 113 is subordinate to the control via the first thermal attenuation control circuit 112. However, in some embodiments, eventually an active use of the thermal disturbance via the evaporation induced heat transfer from the immersion medium 110.1 may be provided in order to counteract deviations between the actual temperature distribution TE and the setpoint temperature distribution TSE of the last lens element 109 and, thus, to achieve a thermal attenuation effect.

For example, in the setpoint state of the last lens element 109, a certain evaporation rate may exist which, depending on the direction of the deviation to be attenuated between the actual temperature distribution TE and the setpoint temperature distribution TSE of the last lens element 109, may then be increased or reduced in order to approach the actual temperature distribution TI of the immersion medium 110.1 to a correspondingly changed setpoint temperature distribution TSI of the immersion medium, i.e. to raise or lower, respectively, the temperature, and, thus to counteract, via the temperature gradient between the immersion medium 110.1 and the last lens element 109, the deviation between the actual temperature distribution TE and the setpoint temperature distribution TSE of the last lens element 109.

Here as well, the temperature and/or the humidity and/or the flow rate of the gas atmosphere 113.1 represent control parameters CP since, via these parameters, the temperature gradient between the immersion medium 110.1 and the last lens element 109 and the heat transport between the immersion medium 110.1 and the last lens element 109, respectively, may be influenced. Accordingly, the second supply device 113.2 also represents an influencing device.

It will be appreciated in this context that, here as well, the given setpoint temperature distribution TSI within the immersion medium 110.1 may be selected arbitrarily in the manner as it has been described above. Furthermore, it will be appreciated that the free surface 110.3 may be the entire or a part of the free surface of the immersion medium 110.1.

The thermal attenuation device 111 further includes as a third thermal attenuation control circuit a control circuit in 114 for a specified direct influencing of the temperature of the last lens element 109.

To this end, the third thermal attenuation control circuit 114 includes a plurality of second temperature adjustment devices in the form of Peltier elements 114.1 evenly distributed at the circumference of the last lens element 109, second temperature sensors 114.2 and the control device 111.1. The Peltier elements 114.1 connected to the control device 111.1 cool or heat the last lens element 109—as will be explained in the following in greater detail—in such a manner that a deviation between the actual temperature distribution TE and the setpoint temperature distribution TSE of the last lens element is counteracted and, thus, a thermal attenuation effect is achieved as well.

Using the second temperature sensors 114.2 and 114.3 evenly distributed at the last lens element 109 and representing a establishment device the temperature of the last lens element 109 at the respective locations of the last lens element 109 is established. The second temperature sensors 114.2 and 114.3 provide corresponding first temperature data to associated inputs 111.2 of the control device 111.1.

It will be appreciated here as well that, instead of the direct measurement via the temperature sensors 114.2, 114.3 evenly distributed at the last lens element 109, a measure meant or establishment of a temperature or of at least one other parameter may be provided at a different location. From this temperature or parameter, in an estimation device, via a corresponding sufficiently accurate estimation—based on a sufficiently accurately known relation between this established parameter and the temperature of the last lens element 109—the temperature of the last lens element 109 may be estimated.

From these first temperature data the control device 111.1 establishes an actual temperature distribution TE within the last lens element 109 using a stored first temperature behavior model of the last lens element 109. As further parameters the first temperature behavior model hereby considers the actual temperature distribution TI of the immersion medium 110.1 and the actual light power (provided to the control device 111.1 by the illumination device 102).

From the actual temperature distribution TE within the last lens element 109, depending on a given setpoint temperature distribution TSE within the last lens element 109, the control device 111.1 establishes a third control value C for the Peltier elements 114.1. Using this third control value C the temperature of the surface of the Peltier elements 114.1 directed towards the surface of the last lens element 109 is adjusted. Accordingly, Peltier elements 114.1 heat or cool the surface of the last lens element 109 in such a manner that the actual temperature distribution TE approaches the setpoint temperature distribution TSE within the last lens element 109.

The temperature of the surface of the Peltier elements 114.1 directed towards the surface of the last lens element 109 thus represents a control parameter CP since, via this temperature the heat transfer between the Peltier elements 114.1 and the last lens element 109 may be influenced. Accordingly, the Peltier elements 114.1 can represent influencing devices.

Figure 3:
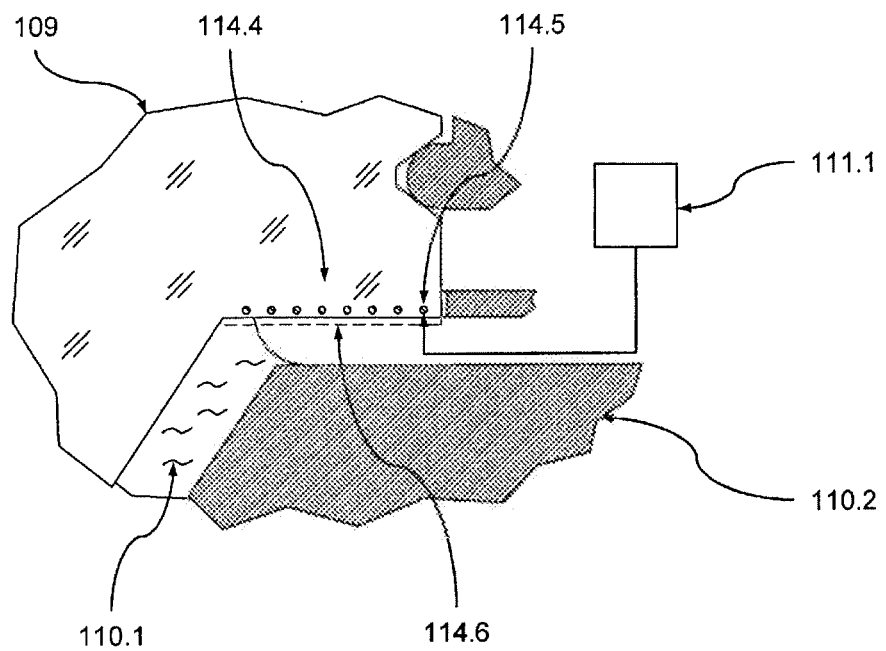
FIG. 3 is a schematic partially sectional view showing the detail D of FIG. 2 for an an embodiment of the optical imaging device.

As shown in FIG. 3, the third thermal attenuation control circuit 114, with other variants of the microlithography device 101, in addition or as an alternative to the Peltier elements 114.1, may comprise a (further) second temperature adjustment device in the form of a resistance heating device 114.4 in the optically unused area of the lens element 109. The resistance heating device 114.4 connected to the control device 111.1 heats the last lens element 109—as will be explained in further detail below—in such a manner that a deviation between the actual temperature distribution TE and the setpoint temperature distribution TSE of the last lens element 109 is counteracted and, thus, a thermal attenuation effect is achieved as well.

FIG. 3, in a schematic view corresponding to detail D of FIG. 2, shows a resistance heating device 114.4 of a further embodiment of the microlithography device 101. As may be seen from FIG. 3, the resistance heating device 114.4 includes a plurality of electrically conductive elements 114.5 suitably connected to each other and to the control device 111.1. The electrically conductive elements 114.5 are embedded within the surface of the last lens element 109.

The electrically conductive elements 114.5 may be fabricated, for example, by placing a metal powder (later forming the electrically conductive elements 114.5) on the surface of the last lens element 109 in a desired configuration. The metal powder is that heated up, e.g. using a infrared laser, to such an extent that the metal powder melts and connects to form the electrically conductive elements. Furthermore, due to its higher density, the molten metal powder sinks into the locally molten matrix of the last lens element 109.

It may be provided that the electrically conductive elements 114.5 are a fully embedded within the matrix on the last lens element 109 as it is shown in FIG. 3. In some embodiments, it may also be provided that the electrically conductive elements 114.5 are only partially surrounded by the matrix of the last lens element 109. In this case a protective layer (as it is indicated in FIG. 3 by the dashed contour 114.6) may be provided. This protective layer 114.6 may protect the electrically conductive elements 114.5 against the aggressive immersion medium 110.1. The protective layer 114.6 may for example be a quartz (SiO) layer that has been applied via a sputter process, a CVD (chemical vapor deposition) process or the like. It will be further appreciated that the protective layer 114.6 may eventually comprise the electrical connections between the electrically conductive elements 114.5 as well as the electrical connections to the control device 111.1.

As had already been explained, using the second temperature sensors 114.2 and 114.3 (see FIG. 2) the temperature of the last lens element 109 is captured at the respective locations of the last lens element 109. The second temperature sensors 114.2 and 114.3 provide corresponding first temperature data to the associated inputs 111.2 of the control device 111.1.

It will be appreciated that, here as well, instead of the direct measurement via the temperature sensors 114.2, 114.3 evenly distributed over the last lens element 109, a measurement or establishment of a temperature or at least another parameter may be provided at a different location. From this measured or established temperature or parameter, in an estimation device, via a corresponding sufficiently accurate estimation—based on a sufficiently accurately known relation between this established parameter/temperature and the temperature of the last lens element 109—the temperature of the last lens element 109 may be estimated.

From these first temperature data the control device 111.1 establishes an actual temperature distribution TE within the last lens element 109 using a stored first temperature behavior model of the last lens element 109. As further parameters the first temperature behavior model hereby considers the actual temperature distribution TI of the immersion medium 110.1 and the actual light power (provided to the control device 111.1 by the illumination device 102).

From the actual temperature distribution TE within the last lens element 109, depending on a given setpoint temperature distribution TSE within the last lens element 109, the control device 111.1 establishes a third control value C for the resistance heating device 114.4. Using this third control value C, via a corresponding electric current within the electrically conductive elements 114.5, the temperature of the resistance heating device 114.4 is adjusted. Accordingly, the resistance heating device 114.4 heats the last lens element 109 in such a manner that the actual temperature distribution TE approaches the setpoint temperature distribution TSE within the last lens element 109.

It will be appreciated that the resistance heating device 114.4 may be segmented in an arbitrarily fine manner, i.e. separated in an arbitrary number of segments selectively controllable by the control device 111.1. Using this, it is possible to achieve an arbitrary desired temperature distribution within the resistance heating device 114.4.

The temperature of the electrically conductive elements 114.5 thus represents a control parameter CP since the heat transfer between the electrically conductive elements 114.5 and the last lens element 109 may be influenced by this temperature. Thus, the electrically conductive elements 114.5 respectively represent an influencing device.

Figure 4:
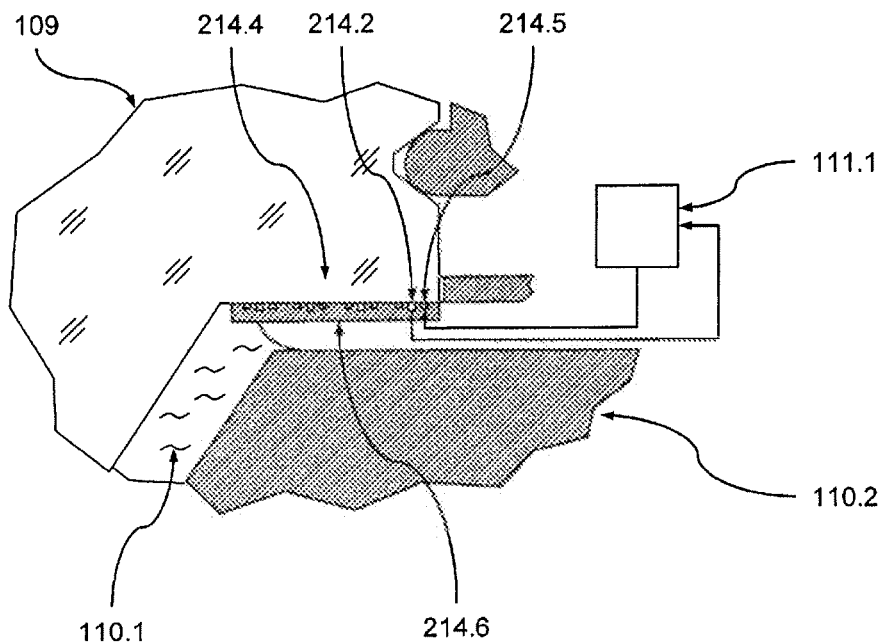
FIG. 4 is a schematic partially sectional view showing the detail D of FIG. 2 for an an embodiment of the optical imaging device.

FIG. 4, in a schematic view corresponding to detail D of FIG. 2, shows a resistance heating device 214.4 of a further embodiment of the microlithography device 101. The resistance heating device 214.4 may be used instead of the resistance heating device 114.4 of FIG. 3. As may be seen from FIG. 4, the resistance heating device 214.4 includes a plurality of electrically conductive elements 214.5 suitably connected to each other and to the control device 111.1. The electrically conductive elements 214.5 are arranged on the surface of the last lens element 109 then and embedded within a protective layer 214.6.

The electrically conductive elements 214.5 may be applied to the surface all the last lens element 109 in the desired configuration using a thin layer technique and/or a thick layer technique. Subsequently, they may be coated with the protective layer 214.6.

The protective layer 214.6, among others protecting the electrically conductive elements 214.5 from the aggressive immersion medium 110.1, may be an arbitrary protective layer. For example, the protective layer 214.6 may be a quartz (SiO) layer that has been applied via a sputter process, a CVD (chemical vapor deposition) process or the like.

The protective layer 214.6 may also comprise a polymeric material. A polyimide (PI) material (such as the material sold by DuPont® under the name Kapton®) is particularly suitable. It will be appreciated that, for example, the protective layer 214.6 may be formed by a polyimide carrier film to which the electrically conductive elements 214.5 are applied in the desired configuration. This carrier film may then be applied to the last lens element 109 and, for example, the adhesively connected to the last lens element 109.

As may be seen from FIG. 4, the protective layer 214.6 holds a plurality of further temperature sensors 214.2 connected to the control device 111.1. These temperature sensors 214.2 (in addition or as an alternative to the temperature sensors 114.2, 114.3) capture the temperature of the last lens element 109 at the respective location. The temperature sensors 214.2 provide corresponding first temperature data to the associated inputs 111.2 of the control device 111.1.

The functionality on the resistance heating device 214.4 is identical to the functionality of the resistance heating device 114.4 as it has been described above. Thus, it is here only referred to the explanations given above. In particular, the resistance heating device 214.4 again may be segmented in an arbitrarily fine manner.

Figure 5:
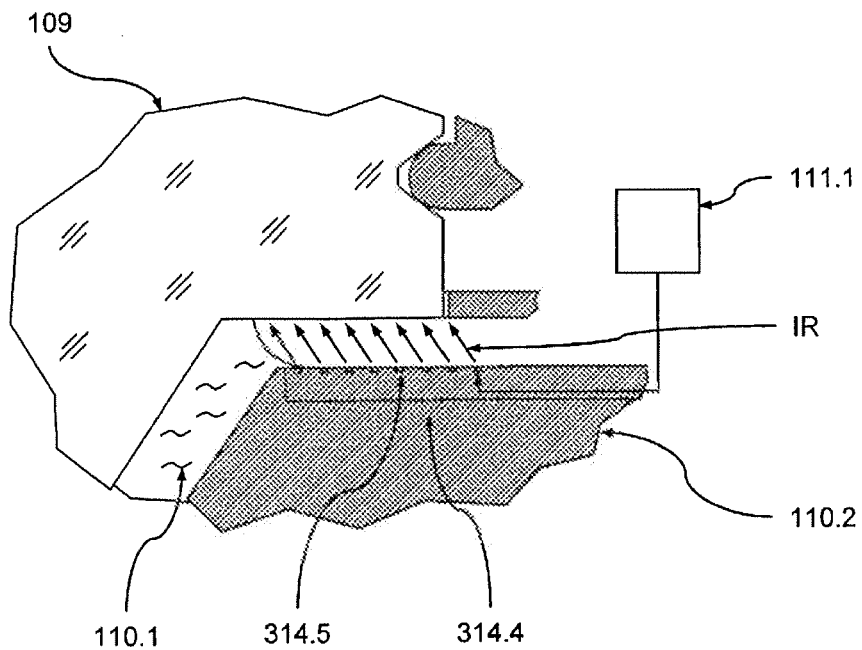
FIG. 5 is a schematic partially sectional view showing the detail D of FIG. 2 for an embodiment of the optical imaging device.

FIG. 5, in a schematic view corresponding to detail D of FIG. 2, shows a radiation heating device 314.4 of a further embodiment of the microlithography device 101. The radiation heating device 314.4 may be used instead of the resistance heating device 114.4 of FIG. 3. As may be seen from FIG. 5 the radiation heating device 314.4 includes a plurality of heating elements 314.5 connected to the control device 111.1.

The heating elements 314.5 are arranged at the immersion frame 110.2. The heating elements 314.5 under the control of the control device 111.1 emit targeted infrared radiation IR towards the last lens element 109 in order to heat the last lens element 109. The heating elements 314.5 may be formed by so-called hollow core fibres guiding the infrared radiation of a coupled infrared radiation source of the control device 111.1 towards the last lens element 109.

The functionality of the radiation heating device 314.4 largely corresponds to the functionality of the resistance heating device 114.4 as it has been described above. Thus, is here mainly referred to the explanations given above.

Here as well, from the actual temperature distribution TE within the last lens element 109, depending on a given setpoint temperature distribution TSE within the last lens element 109, the control device 111.1 establishes a third control value C for the radiation heating device 314.4. Using this third control value C the radiation intensity of the heating elements 314.5 is adjusted. Accordingly, the heating elements 314.5 heat the last lens element 109 in such a manner that the actual temperature distribution TE approaches the setpoint temperature distribution TSE within the last lens element 109.

The radiation intensity of the heating elements 314.5 thus represents a control parameter CP since the heat transfer between the heating elements 314.5 and the last lens element 109 may be influenced by this radiation intensity. Thus, the heating elements 314.5 respectively represent an influencing device.

It will be appreciated that the radiation heating device 314.4 may allow an arbitrarily finely segmented radiation of the last lens element 109. In other words, the radiation heating device 314.4 may comprise an arbitrary number of segments selectively controllable by the control device 111.1. Using this, it is possible to provide an arbitrary radiation intensity distribution via the radiation heating device 314.4.

The thermal attenuation control device 111 further includes a first shielding in the form of a thermally insulating coating 115 of the last lens element 109, the coating 115 forming a thermal decoupling device in the form of a first passive thermal attenuation component of the attenuation control device 111.

The coating 115 extends over the section 109.2 of the surface of the last lens element 109 that it is located adjacent to the immersion of medium 110.1 and is optically unused when projecting the projection pattern onto the wafer 105. Via this thermally insulating coating 115 the last lens element 109 and the immersion zone 110 with the immersion medium 110.1 are section-wise thermally decoupled such that, at least external to the section 109.1 of the surface of the last lens element 109 optically used, thermal disturbances in the immersion medium 110.1 are prevented from directly propagating within the last lens element 109.

The coating 115 may be of any suitable material or material combination providing sufficient thermal insulation properties. In the embodiment shown in FIG. 2 the coating 115 includes a layer of an organic material, here a polyurethane (PU) resin, that has been applied to the surface section 109.2 of the last lens element 109 via a suitable technique such as, for example, a casting technique, a varnishing technique etc. After its appliance the surface of the organic layer may be treated using any known surface treatment technique in order to provide a desired surface roughness.

Part or all of the surface of the organic layer not contacting the last lens element 109 may be provided with a suitable reflective coating. This reflective coating reflects projection light scattered by the surface of the wafer 105.1 and/or the immersion medium 110.1 and/or the immersion frame 110.2 etc., thus, preventing (long-term) damage to the organic layer of the coating 115 that might otherwise be caused by such scattered projection light.

The shielding 115, in principle, may be designed in any suitable way to provide the thermal decoupling of the last lens element 109 from its environment, in particular the immersion medium. In particular, it may be a simple single-layer or multi-layer thermal insulation. As will be explained in further detail below, it may also be a combination of two or more layers with at least one highly thermally conductive layer and at least one thermally insulating layer. In this case, the highly thermally conductive layer may serve to transport heat towards the circumference of the last lens element (to a heat sink eventually provided at this location) and, thus, to prevent or reduce, respectively, its introduction into the last lens element.

In some embodiments, on its side facing away from the last lens element 109, the shielding 115 may have a hydrophobic surface. This hydrophobic surface may eventually be formed by a separate layer only provided for this reason. Using this, at least largely situations may be avoided wherein separate drops or droplets of the immersion medium 110 accumulate at the (eventually coated) surface of the last lens element 109. Such drops or droplets of immersion medium might otherwise evaporate and cause formation of a locally concentrated strong heat sink leading to a strong locally concentrated thermal disturbance in the last lens element 109.

Such drops or droplets of immersion medium 110.1 may for example form at the surface areas of the last lens element 109 that are only temporarily wetted with the immersion medium 110.1 (e.g. due to wafer movement induced immersion medium level alterations during operation of the microlithography device 101). The hydrophobic surface, in an advantageous manner, hinders formation of such drops or droplets of immersion medium 110.1 on the (eventually coated) surface of the last lens element 109.

Figure 6:
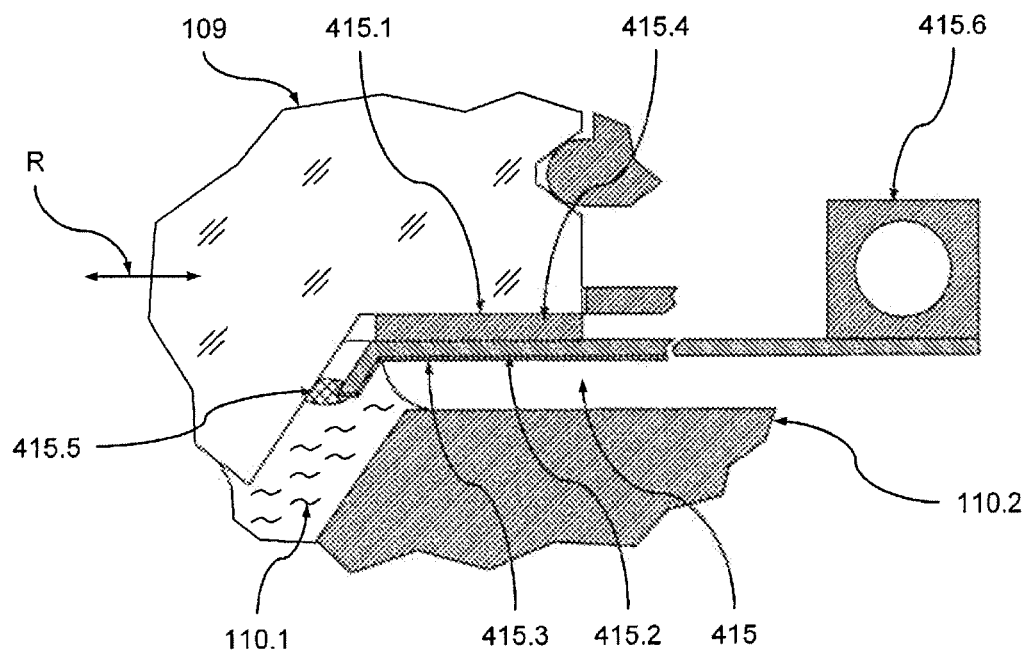
FIG. 6 is a schematic partially sectional view showing the detail D of FIG. 2 for an embodiment of the optical imaging device.

FIG. 6, in a schematic view corresponding to detail D of FIG. 2, shows a thermal decoupling device in the form of a thermal shielding 415 of a further embodiment of the microlithography device 101. The shielding 415 may be used instead of the shielding 115 of FIG. 2.

As may be seen from FIG. 6, the shielding 415 has a multi-layer design as it has been mentioned above. The shielding 415 includes a combination of a thermally insulating first layer 415.1 located immediately adjacent to the last lens element 109 and a highly thermally conductive second layer 415.2 located immediately adjacent to the first layer 415.1. Furthermore, a hydrophobic third layer 415.3 is applied to the outer surface of the second layer 415.2.

The thermally insulating the first layer 415.1 includes a spacer body 415.4. The spacer body 415.4 is of sufficient rigidity to keep its shape under any normal operating conditions of the microlithography device 101. Thus, the spacer body 415.4, under normal operating conditions, provides a defined distance between the surface of the last lens element 109 and the second layer 415.2. In some embodiments, separate spacer elements may be provided instead of a single spacer body.

The spacer body 415.4 is permeable to a fluid (i.e. a gas and/or a liquid). For example, an open-celled foam may be used to form the spacer body 415.4. Thus, between the surface of the last lens element 109 and the second layer 415.2, an interstice is defined forming the first layer 415.1. The interstice forming the first layer 415.1 is filled with a fluid (such as a gas or a liquid) of low thermal conductivity. Eventually, the interstice 415.1 may be (continuously or intermittently) rinsed with a suitably temperature adjusted fluid to guarantee the desired thermally insulating effect of the first layer 415.1.

In order to prevent ingress of immersion medium 110.1 into the interstice 415.1 a circumferential sealing element 415.5 is provided between the last lens element 109 and the second layer 415.2. The sealing element 415.5 may be a ring formed by an adhesive which, in addition, provides fixation on the second layer of 415.2 with respect to the last lens element 109.

The second layer 415.2, due to its high thermal conductivity, guarantees a good heat transfer in the radial direction R of the last lens element 109. Thus, thermal disturbances induced by the immersion medium 110.1 are rapidly reduced or even fully compensated by a correspondingly high heat transfer within the second layer 415.2. Consequently, such thermal disturbances, if at all, may propagate only to a reduced extent towards the last lens element 109. In other words, an efficient thermal attenuation effect is achieved. A further reduction of the propagation of such thermal disturbances is provided by the thermally insulating first layer 415.1. In other words, via the shielding 415 forming a thermal decoupling device, the last lens element 109 is effectively thermally decoupled from its environment, in particular from the immersion medium 110.1.

In order to achieve a rapid heat transfer within the second layer 415.2 a stabilizing device 415.6 may be provided at the outer circumference of the second layer 415.2. The stabilizing device may have a high heat capacity and, thus, a stable temperature during operation of the microlithography device 101. For example, the stabilizing device 415.6 may be formed by a circuit of a heat carrier medium.

The hydrophobic third layer 415.3, again, reduces the likelihood of the formation of local heat sinks due to the evaporation of accumulated drops or droplets of immersion medium 110.1 as it has been described above. The hydrophobic third layer of 415.3 may, for example, be formed by a polyimide (PI) material as it has been mentioned above.

Figure 7:
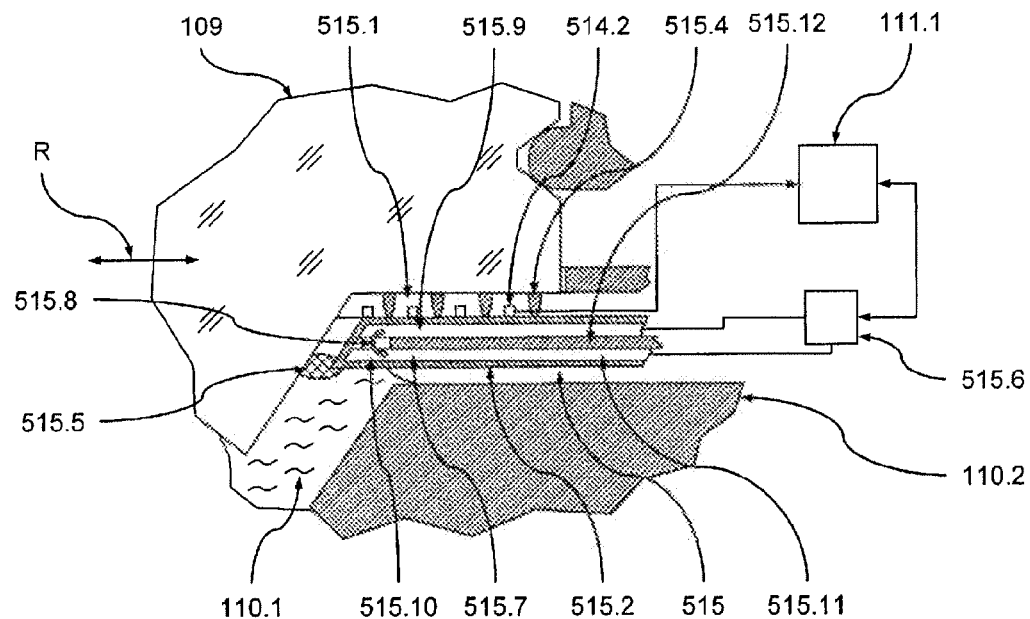
FIG. 7 is a schematic partially sectional view showing the detail D of FIG. 2 for an embodiment of the optical imaging device.

FIG. 7, in a schematic view corresponding to detail D of FIG. 2, shows a thermal shielding 515 of a further embodiment of the microlithography device 101. The shielding 515 may be used instead of the shielding 115 of FIG. 2 or instead of the shielding 415 of FIG. 6.

As may be seen from FIG. 7, the shielding 515 has a multi-layer design as it has been mentioned above. The shielding 515 includes a combination of a thermally insulating first layer 515.1 located immediately adjacent to the last lens element 109 and a second layer 515.2 located immediately adjacent to the first layer 515.1

The thermally insulating the first layer 515.1 includes a plurality of spacer elements 515.4 evenly distributed at the circumference of the last lens element 109. The spacer elements 515.4 are of sufficient rigidity to keep their shape under any normal operating conditions of the microlithography device 101. Thus, the spacer elements 515.4, under normal operating conditions, provide a defined distance between the surface of the last lens element 109 and the second layer 515.2.

The spacer elements 515.4 define an interstice forming the first layer 515.1. The interstice forming the first layer 515.1 is filled with a fluid (such as a gas or a liquid) of low thermal conductivity. Eventually, the interstice 515.1 may be (continuously or intermittently) rinsed with a suitably temperature adjusted fluid to guarantee the desired thermally insulating effect of the first layer 515.1.

In order to prevent ingress of immersion medium 110.1 into the interstice 515.1 a circumferential sealing element 515.5 is provided between the last lens element 109 and the second layer 515.2. The sealing element 515.5 may be a ring formed by an adhesive which, in addition, provides fixation on the second layer of 515.2 with respect to the last lens element 109.

The second layer 515.2 again provides a good heat transfer in the radial direction R of the last lens element 109. Thus, thermal disturbances induced by the immersion medium 110.1 are rapidly reduced or even fully compensated by a correspondingly high heat transfer within the second layer 515.2. Consequently, such thermal disturbances, if at all, may propagate only to a reduced extent towards the last lens element 109. In other words, an efficient thermal attenuation effect is achieved. A further reduction of the propagation of such thermal disturbances is provided by the thermally insulating first layer 515.1. In other words, via the shielding 515 forming a thermal decoupling device, the last lens element 109 is effectively thermally decoupled from its environment, in particular from the immersion medium 110.1.

The rapid heat transfer within the second layer 515.2 is achieved by providing a channel system 515.7 extending in the radial direction R within the second layer 515.2. A stabilizing device in the form of a pumping and temperature adjusting device 515.6 provides a heat carrier medium circulation with a (e.g., continuous) flow 515.8 of a heat carrier medium within the channel system 515.7. The heat carrier medium of the flow 515.8 is adjusted by the stabilizing device 515.6 to have a defined temperature and/or flow rate.

The flow 515.8 initially runs, in a first channel 515.9 of the second layer 515.2, in the radial direction R towards a redirecting area 515.10 at the inner circumference of the second layer 515.2. At the redirecting area 515.1 the flow 515.8 is redirected in order to flow back, within a second channel 515.11 of the second layer 515.2, towards the outer circumference of the second layer 515.2. Leaving the second channel 515.11 the flow 515.8 returns to the stabilizing device 515.6 where it is again adjusted in temperature and/or flow rate and re-circulated to the heat carrier medium circulation.

In the most simple case shown in FIG. 7 the channel system 515.9 to 515.11 is formed by a thin hollow body 515.2 and a thin rib 515.12. The rib 515.12 is located within the hollow body 515.2 and extends in the radial direction R and in the circumferential direction of the last lens element 109. The rib 515.12 separates the first channel 515.9 and the second channel 515.11. The second channel 515.11, via which the heat carrier medium is again transported radially outwards towards the stabilizing device 515.6, can be located on the side facing away from the last lens element 109 in order to achieve a rapid removal of thermal disturbances from the area of the last lens element 109. However, it will be appreciated that any other suitable configuration of such a channel system providing such a rapid removal of thermal disturbances may be used.

Again, a hydrophobic third layer may be provided at the outer surface of the second layer 515.2 in order to reduce the likelihood of the formation of local heat sinks due to the evaporation of accumulated drops or droplets of immersion medium 110.1 as it has been described above.

As shown in FIG. 7, the stabilizing device 515.6 may be connected to and controlled by the control device 111.1. Thus, it is possible to actively control the thermal attenuation effect on the shielding 515. As a consequence, the shielding 515 then forms an active thermal decoupling device.

In some embodiments, the stabilizing device 515.6 is controlled in such a manner that a given temperature distribution (e.g., an even temperature) is substantially maintained (throughout the operation of the microlithography device 101) at the surface of the second layer 515.2 (forming a thermal shielding element) facing the last lens element 109. To this end, further temperature sensors 514.2 connected to the control device 111.1 may be provided at this surface. The control device 111.1 may then use the temperature data provided by the temperature sensors 514.2 to control the stabilizing device 515.6 in the manner described above.

Figure 8:
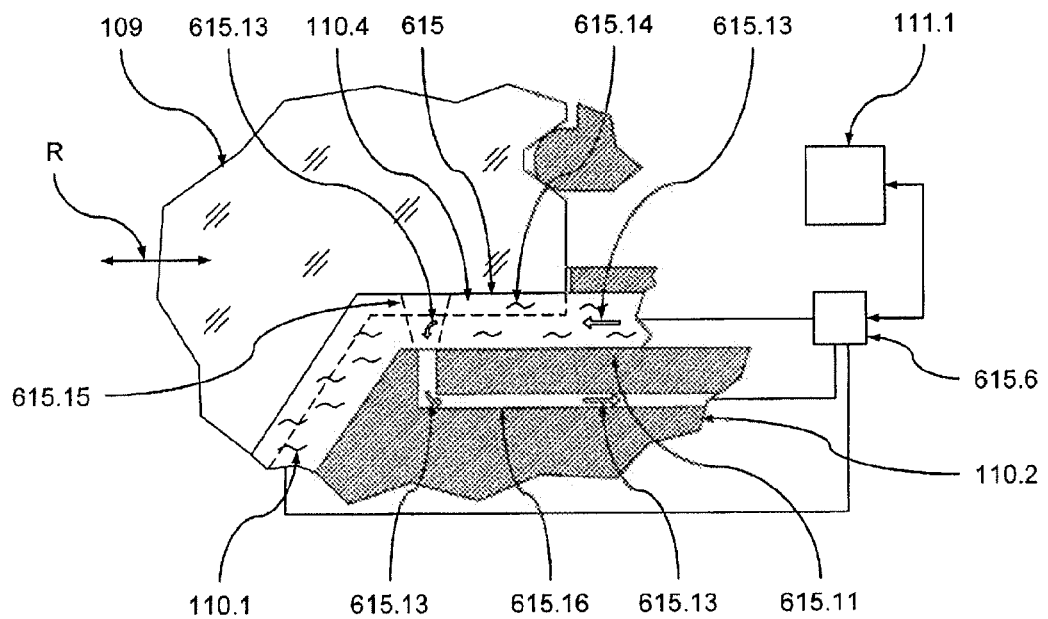
FIG. 8 is a schematic partially sectional view showing the detail D of FIG. 2 for an embodiment of the optical imaging device.

FIG. 8, in a schematic view corresponding to detail D of FIG. 2, shows a thermal shielding 615 of a further embodiment of the microlithography device 101. The shielding 615 may be used instead of the shielding 115 of FIG. 2, instead of the shielding 415 of FIG. 6 or instead of the shielding 515 of FIG. 7.

As may be seen from FIG. 8, the shielding 615 is formed by a (e.g., continuous) flow 615.13 of a heat carrier medium 615.14 provided within the part 110.4 of the gap between the last lens element 109 and the immersion frame 110.2 that is not filled with the immersion medium 110.1. The flow 615.13 is provided by a stabilizing device in the form of a pumping and temperature adjusting device 615.6 that provides the heat carrier medium with a defined temperature and flow rate.

The flow 615.13 initially runs in the radial direction R towards a contact zone 615.14. Within this contact zone 615.15 the heat carrier medium 615.14 contacts and eventually mixes with the immersion medium 110.1. In the area of the contact zone 615.5 a channel 615.16 is provided within the immersion frame 110.2. The channel 615.16 opens towards the contact zone 615.5. Via this channel 615.16 the heat carrier medium 615.14 and, eventually, part of the immersion medium 110.1 (eventually mixed with the heat carrier medium 615.14) are drawn off from the gap between the last lens element 109 and the immersion frame 110.2 and re-circulated back to the stabilizing device 615.6.

In the stabilizing device 615.6, if necessary, the fraction of the immersion medium 110.1 drawn off together with the heat carrier medium 615.14 is separated from the heat carrier medium 615.14. The stabilizing device 615.6 re-adjusts the temperature and flow rate of the heat carrier medium 615.4 and re-circulates to the heat carrier medium circulation.

The stabilizing device 615.6 also provides the immersion medium 110.1 to the immersion zone 110 at the desired flow rate. It will be appreciated that the flow rate of the immersion medium 110.1 provided to the immersion zone 110 and the flow rate of the heat carrier medium 615.14 provided to the part 110.4 of the gap between the last lens element 109 and the immersion frame 110.2 as well as the flow rate within the channel 615.16 are mutually adapted to each other in order to achieve the configuration as described above (i.e. with the immersion medium 110.1 and the heat carrier medium 615.14 contacting in the contact zone 615.15). Furthermore, these flow rates are mutually to adapted each other in order to avoid undesired pressure fluctuations within the area of the last lens element 109.

The flow 615.13 provides a good heat transport away from the last lens element 109 in the radial direction R of the last lens element 109. Thus, thermal disturbances induced by the immersion medium 110.1 or the immersion frame 110.2 are rapidly reduced or even fully compensated by a correspondingly high heat transport provided by the flow 615.13. Consequently, such thermal disturbances, if at all, may propagate only to a reduced extent towards the last lens element 109. In other words, an efficient thermal attenuation effect is achieved. A further reduction of the propagation of such thermal disturbances may be provided by a thermally insulating first layer on the last lens element as it is indicated by the dashed contour 615.1 in FIG. 8. In other words, via the shielding 615 forming a thermal decoupling device, the last lens element 109 is effectively thermally decoupled from its environment, in particular from the immersion medium 110.1.

As shown in FIG. 8, the stabilizing device 615.6 may be connected to and controlled by the control device 111.1. Thus, it is possible to actively control the thermal attenuation effect on the shielding 615.

The thermal attenuation device 111 further includes a ring shaped second shielding 116 arranged between the holder 117 of the last lens element 109 and the holder of 118 on the penultimate lens element 108 and forming a second passive thermal attenuation component and, thus, a thermal decoupling device.

The second shielding 116 extends from the connection area of the two holders 117 and 118 (to the housing of the objective 104) up to the section 109.3 on the surface of the last lens element 109 that is optically unused during projecting the projection pattern onto the wafer 105. The second shielding 116 further serves as the carrier for the Peltier elements 114.1.

The second shielding 116 as shown in FIG. 8 includes a highly thermally conductive material. In the connection area of the two holders 117 and 118 the second shielding 116 is connected to a temperature-stabilized intermediate element 119 which is, via a ring channel 119.1, passed through with a heat carrier medium, e.g. water, that is held at a constant temperature via a heat carrier medium source 119.2.

Using a constant temperature of the temperature-stabilized intermediate element 119 and the high thermal conductivity of the second shielding 116 an approximately constant temperature results on the side of the second shielding 116 facing towards the holder 117. Accordingly, a thermal shielding of the holder of 117 and of a part of the last lens element 109 from the rest of the objective 104 is achieved such that, here as well, an attenuation of thermal disturbances of the last lens element 109 introduced via this side is achieved.

it will be appreciated that, in principle, the second shielding 116 again may be designed in any suitable way. In some embodiments, it may also be designed as a simple single-layer or multi-layer thermal insulation similar to the variants of the first shielding described above. However, it may also be a combination of two or more layers comprising at least one highly thermally conductive layer and at least one thermally insulating layer. In particular, in the embodiment shown in FIG. 8, a correspondingly insulating layer may be formed on the side of the second shielding 116 facing the holder 117.

Figure 9:
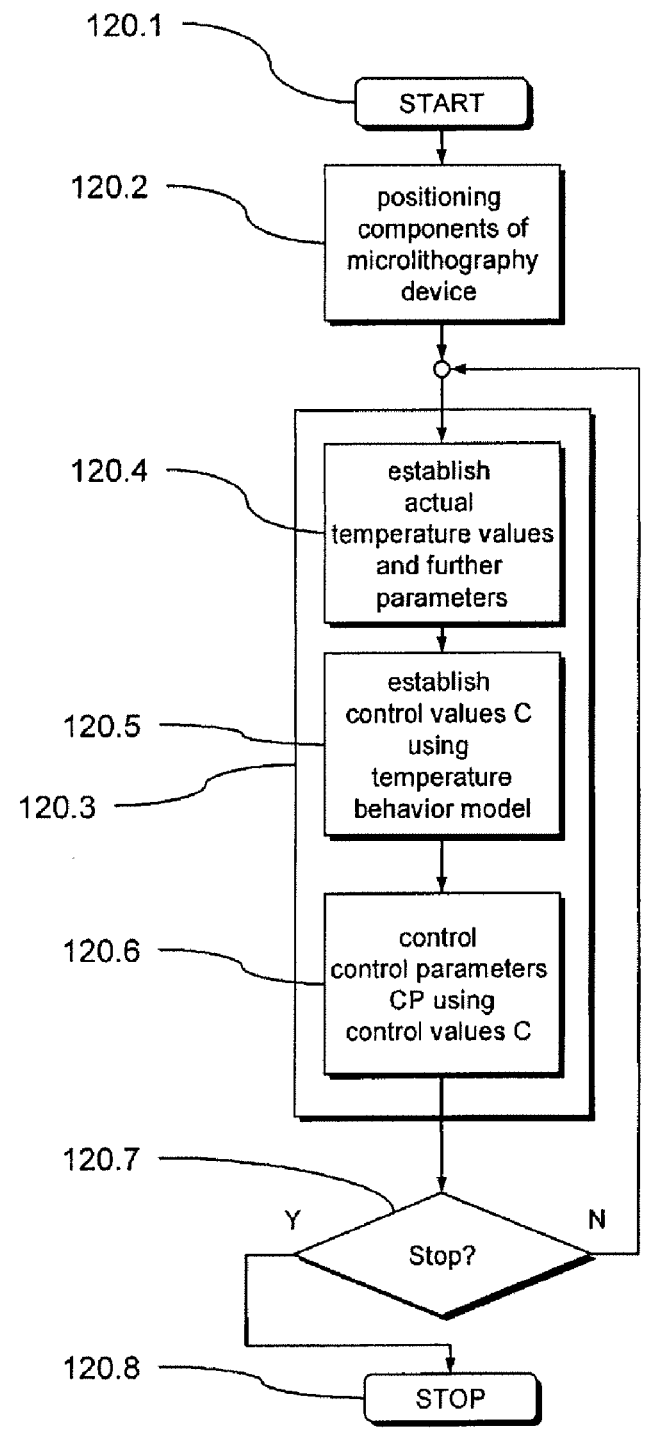
FIG. 9 is a block diagram of an embodiment of the optical imaging method which may be executed with the optical imaging device of FIG. 1.

FIG. 9 shows a block diagram of an embodiment of the optical imaging method which may be executed with the microlithography device 101.

First, in a step 120.1 execution of the method starts. In a step 120.2 the components of the microlithography device 101 are mutually positioned with respect to each other such that the configuration described above is achieved.

In a step 120.3 at least a part of the projection pattern on the mask 103.1 is projected onto the wafer 105.1 in the matter as it has been described above. In the step 120.3, in parallel to this projection, a thermal attenuation of fluctuations in the temperature distribution of the last lens element 109 induced by the environment of the last lens element, in particular by the immersion medium 110.1, is provided via the thermal attenuation device 111 as it has been described above.

To this end, in a step 120.4, the corresponding temperatures are established via the temperature sensors 112.2, 112.3, 114.2, 114.3 as it has been described above. Furthermore, further parameters such as the actual supply temperature TIF of the immersion medium 110.1, the flow rate of the immersion medium 110.1 and the actual light power of the illumination device 102 are established as it has been described above.

In a step 120.5 the control device 111 establishes the actual temperature distribution TI within the immersion medium 110.1 in the immersion zone 110 as well as the actual temperature distribution TE of the last lens element 109. This is done using the stored temperature behavior model and using the data established in step 120.3 as it has been described above. Furthermore, the control device 111 establishes the control values C for the separate influencing devices (e.g. temperature adjustment device 112.2, supply device 112.1, second supply device 113.2, Peltier elements 114.1 etc.).

The temperature behavior model hereby represents the relation between the captured or otherwise established temperatures as well as further parameters (e.g. flow rate of the immersion medium 110.1, light power of the illumination device 102 etc) and the temperature distribution to be expected within the respective object of the temperature behavior model (i.e. the last lens element 109 and the immersion medium 110.1, respectively).

The respective part of the temperature behavior model may have been established for the respective object of the temperature behavior model (i.e. the last lens element 109 or the immersion medium 110.1) in an empiric manner and/or via simulation calculations. In particular for regularly repeated situations during operation of the microlithography device 101 a sufficiently accurate estimation of the actual temperature distribution TI within the immersion medium 110.1 in the immersion zone 110 as well as of the actual temperature distribution TE within the last lens element 109 May be achieved.

In a step 120.6, using the established control values C, the control parameters CP are influenced by controlling the respective influencing devices (e.g. temperature adjustment device 112.2, supply device 112.1, second supply device 113.2, Peltier elements 114.1 etc.) via the control device 111.1 in the manner as it has been described above.

In a step 120.7 it is checked if execution of the method is to be stopped. If this is the case, execution of the method is stopped in a step 120.8. Otherwise it is jumped back to step 120.3.

In the foregoing, embodiments have been described using an example where a plurality of active thermal attenuation control circuits 112, 113, 114 and passive thermal attenuation components 115, 116 are provided in combination. In some embodiments, the single active thermal attenuation control circuits and passive thermal attenuation components may each be used alone or in an arbitrary combination.

Furthermore, while in the foregoing examples, a part of the last lens element 109 is immersed in an immersion medium 110.1 during optical imaging, embodiments may also be used in the context of immersion systems wherein an immersion zone at least temporarily filled with an immersion medium (in addition or as an alternative to the immersion zone between the last lens element and the wafer) is located between two optical elements of the optical element group. Such multiple immersion systems or double immersion systems are known for example from WO 2006/080212 A1, WO 2004/019128 A2, WO 2006/051689 A1, WO 2006/126522 A1, WO 2006/121008 A1 and U.S. Pat. No. 7,180,572 B1, the entire disclosure of all of which is included herein by reference.

Figure 10:
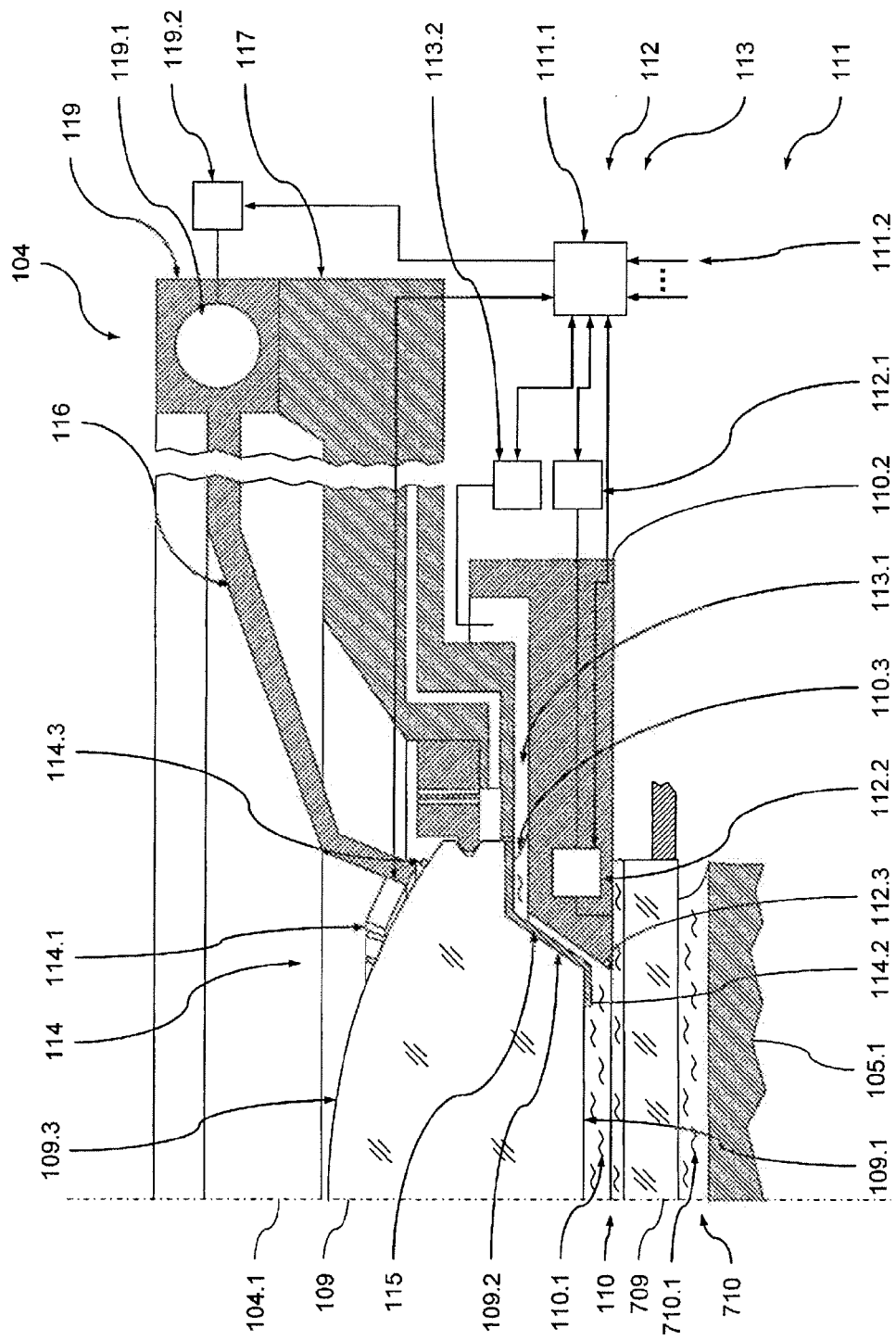
FIG. 10 is a schematic partially sectional view of an embodiment of the optical imaging device.

FIG. 10, in a view corresponding to the view of FIG. 2, schematically shows such a double immersion system which may be used in the microlithography device 101. Here, the lens element 109 is not located immediately adjacent to the wafer 105.1 but adjacent to a further optical element in the form of a lens element 709 located between the lens element 109 and the wafer 105.1. The immersion zone 110 is located between the lens element 109 and the lens element 709 while a further immersion zone 710 filled with a further immersion medium 710.1 is located between the further lens element 709 and the wafer 105.1.

The thermal attenuation device 111 is configured in a manner as it has been described above in order to provide thermal attenuation of environment induced thermal disturbances tending to cause thermal disturbances within the temperature distribution of the lens element 109. It will be appreciated that a further thermal attenuation device may be provided to provide thermal attenuation of environment induced, in particular immersion medium induced thermal disturbances tending to cause thermal disturbances within the temperature distribution of the further lens element 709. This further thermal attenuation device may be designed in a manner similar to the thermal attenuation device 111. Furthermore, the thermal attenuation device 111 may also be designed to provide such thermal attenuation for the further lens element 709.

The immersion medium 110.1 may be identical with or different from the immersion medium 610.1. Any suitable immersion medium may be used. Examples of such immersion media are heavy water or heavy oxygen water such as $D_2O$, $D_2O^*$, $H_2O^*$, wherein O* may comprise the isotopes $O^{16}$, $O^{17}$ and $O^{18}$. These immersion media may be mixed in an arbitrary ratio in order to achieve a desired refractive index in the respective immersion zone 110 and 710, respectively, and/or in order to achieve a desired relation between the refractive indices of the two immersion media and/or a desired relation between the refractive indices of the optical elements 109, 709 and one or both of the immersion media 110.1, 710.1. Corresponding examples and values of refractive indices for such mixtures are given in US 2006/092533 A1, US 2006/066926 A1 and WO 2005/106589 A1, the entire disclosure of each of which is incorporated herein by reference.

While examples are described wherein the optical element group is composed of refractive optical elements exclusively, in some embodiments, optical element groups that include, alone or in an arbitrary combination, refractive, reflective or diffractive optical elements can be used, in particular in the case of performing the imaging process at different wavelengths.

Furthermore, while embodiments have been described in relation to microlithography, other applications (e.g., imaging processes) are also possible. Other embodiments are in the following claims.

The invention claimed is:
1. An optical imaging device, comprising:
a mask device for receiving a mask comprising a pattern;
a substrate device for receiving a substrate;
an immersion liquid; and
a projection device comprising a plurality of optical elements and a thermal attenuation device, the optical imaging device being configured so that during operation the plurality of optical elements projects the pattern onto the substrate and the thermal attenuation device reduces fluctuations in a temperature distribution of an immersion element of the plurality of optical elements induced by the immersion liquid, wherein the immersion element is the optical element closest to the substrate and adjacent to the immersion liquid so that the immersion liquid is located between the immersion element and the substrate, the immersion element comprising a first area and a second area where the first area is optically used during operation of the optical imaging device and the second area is optically unused during operation of the optical imaging device, the second area comprising a first section adjacent the immersion liquid during operation of the optical imaging device and a second section non-adjacent to the immersion liquid during operation of the optical imaging device, and the thermal attenuation device comprises a first shielding which is a thermal decoupling device that thermally shields at least a part of the first section of the second area of the immersion element, and the first shielding is between the immersion element and the immersion liquid.

2. The optical imaging device according to claim 1, wherein the first shielding shields the entire first section of the second area of the immersion element.

3. The optical imaging device according to claim 1, wherein the projection device comprises a holding device that holds the immersion element and the thermal attenuation device comprises a second shielding, the second shielding being a thermal decoupling device that thermally shields at least a part of the holding device.

4. The optical imaging device according to claim 3, wherein the second shielding thermally shields at least a part of an area of the holding device located adjacent to an adjacent section of the projection device.

5. The optical imaging device according to claim 1, wherein the thermal attenuation device comprises a thermal decoupling device comprising at least one passive thermally insulating device.

6. The optical imaging device according to claim 5, wherein the passive thermally insulating device comprises an organic material.

7. The optical imaging device according to claim 1, wherein the thermal attenuation device comprises a thermal decoupling device comprising at least one active shielding having at least one shielding element and at least one temperature adjustment device connected to the shielding element, wherein the temperature adjustment device is arranged such that a selectable temperature distribution on at least one surface of the shielding element is substantially maintained during operation of the optical imaging device.

8. The optical imaging device of claim 1, wherein the thermal attenuation device comprises a thermal decoupling device comprises at least one active shielding element, the temperature adjustment device being adapted to provide a flow of a heat carrier medium in an area of the at least one shielding element.

9. The optical imaging device according to claim 1, wherein the thermal decoupling device includes at least one of at least one hydrophobic surface and a hydrophobic coating facing away from the immersion element.

10. The optical imaging device according to claim 1, wherein during operation a setpoint temperature distribution is given for the immersion element and the thermal attenuation device is adapted to keep a given maximum deviation from the setpoint temperature distribution.

11. The optical imaging device according to claim 10, wherein the maximum deviation is less than 10 mK.

12. The optical imaging device according to claim 1, wherein the during operation the immersion element has an actual temperature distribution and a setpoint temperature distribution given for the immersion element and the thermal attenuation device includes at least one establishing device, a control device connected to the establishing device and an influencing device connected to the control device, where the establishing device establishes at least one parameter P influencing the actual temperature distribution or being representative of the actual temperature distribution, the control device, as a function of the established parameter P and the setpoint temperature distribution, establishes at least one control value C, and the influencing device, as a function of the at least one established control value C, influences a control parameter that influences the actual temperature distribution so that a deviation of the actual temperature distribution from the setpoint temperature distribution is reduced.

13. The optical imaging device according to claim 12, wherein the parameter P is a local temperature of the immersion liquid or the immersion element.

14. The optical imaging device of claim 12, wherein the establishment device includes at least one temperature sensor for measuring a local temperature of the immersion liquid or the immersion element.

15. The optical imaging device of claim 12, wherein the establishment device comprises at least one estimation device for estimating a local temperature of the immersion liquid or the immersion element.

16. The optical imaging device according to claim 12, wherein the control parameter is one of
a temperature of the immersion liquid,
a flow rate of the immersion liquid,
a temperature of a gas atmosphere contacting the immersion liquid,
a humidity of a gas atmosphere contacting the immersion liquid,
a flow rate of a gas atmosphere contacting the immersion liquid, and
a temperature of at least one temperature adjustment element being in operative connection with the immersion element.

17. The optical imaging device according to claim 12, wherein the control device is adapted to use a temperature behavior model of the immersion element and/or of the immersion liquid for establishing the control value C.

18. The optical imaging device according to claim 12, wherein the control device comprises a memory storing model data representing the temperature behavior model or parameters for calculating model data representing the temperature behavior model and uses the model data for establishing the control value C.

19. The optical imaging device according to claim 12, wherein the influencing device comprises at least one first temperature adjustment device for adjusting the temperature of the immersion liquid.

20. The optical imaging device according to claim 19, wherein the control device establishes the control value C for the first temperature adjustment device as a function of an alteration ΔTIE of the temperature distribution to be expected within the immersion liquid so that the first temperature adjustment device adjusts the temperature of the immersion liquid to a supply temperature, where the supply temperature is selected such that a given temperature distribution is expected within the immersion liquid.

21. The optical imaging device according to claim 19, wherein the first temperature adjustment device is arranged in the area of an inlet of the immersion liquid.

22. The optical imaging device according to claim 12, wherein the influencing device comprises an adjustment device for influencing the evaporation induced cooling of the immersion liquid in a contact area with an adjacent gas atmosphere, where the adjustment device adjusts at least one state parameter of a gas atmosphere contacting the immersion liquid and the at least one state parameter is a temperature of the gas atmosphere, a humidity of the gas atmosphere or a flow rate of the gas atmosphere.

23. The optical imaging device according to claim 22, wherein the control device establishes the control value C for the adjustment device as a function of the state of the immersion liquid in the contact area so that one of a given evaporation induced cooling and substantially no evaporation induced cooling of the immersion liquid is expected in the contact area.

24. The optical imaging device according to claim 22, wherein the contact area substantially extends over an entire free surface of the immersion liquid.

25. The optical imaging device according to claim 1, wherein the thermal attenuation device comprises a temperature adjustment device connected to the immersion element for adjusting the temperature of the immersion element.

26. The optical imaging device according to claim 25, wherein during operation the control device establishes a control value for the temperature adjustment device as a function of a temperature distribution within the immersion liquid and the temperature adjustment device adjusts the temperature of the immersion element so that a deviation of an actual temperature distribution from a setpoint temperature distribution that is due to the established temperature distribution within the immersion liquid is reduced.

27. The optical imaging device according to claim 25, wherein the temperature adjustment device is arranged in the area of a circumference of the immersion element.

28. The optical imaging device according to claim 25, wherein the temperature adjustment device comprises at least one Peltier-Element.

29. The optical imaging device according to claim 25, wherein the temperature adjustment device comprises at least one resistance heating device embedded within the immersion element or covered with a protection layer against the immersion liquid.

30. The optical imaging device according to claim 25, wherein the temperature adjustment device comprises at least one radiation heating device.

31. The optical imaging device according to claim 1, wherein the immersion element comprises a material having a refractive index larger than a refractive index of quartz glass and having a refractive index having a higher temperature sensitivity than the refractive index of quartz glass.

32. The optical imaging device according to claim 1, wherein the immersion element is made of a spinel or a LuAG.

33. The optical imaging device according to claim 1, wherein a numerical aperture of the projection device during operation is at least one of at least 1.3.

34. The optical imaging device of claim 1, wherein the thermal attenuation device further comprises a second shielding which is a thermal decoupling device that thermally shields at least a part of the second section of the second area of the immersion element.

35. The optical imaging device according to claim 34, wherein the second shielding shields the entire second section of the second area of the immersion element.

36. The optical imaging device according to claim 1, wherein the first shielding is between the immersion liquid and the first section of the second area of the immersion element.

37. The optical imaging device according to claim 1, wherein the first shielding contacts the first section of the second area of the immersion element.

38. A method, comprising:
using a projection device to project a pattern from a mask onto a substrate, wherein the projection device comprises:
a plurality of optical elements comprising an immersion element, the immersion element being the optical element closest to the substrate and adjacent to an immersion liquid between the optical elements and the substrate, the immersion element comprising a first area and a second area where the first area is optically used and the second area is optically unused, the second area comprising a first section adjacent the immersion liquid and a second section non-adjacent to the immersion liquid, and
a thermal attenuation device comprising a first shielding-which thermally shields at least a part of the first section of the second area of the immersion element, and the first shielding is between the immersion element and the immersion liquid, and
using the thermal attenuation device to reduce fluctuations in a temperature distribution of the immersion element induced by the immersion liquid.

39. The method of claim 38, wherein the thermal attenuation device further comprises a second shielding which is a thermal decoupling device that thermally shields at least a part of the second section of the second area of the immersion element.

40. The method according to claim 38, wherein the first shielding is between the immersion liquid and the first section of the second area of the immersion element.

41. The method according to claim 38, wherein the first shielding contacts the first section of the second area of the immersion element.

42. An optical imaging device, comprising:
a mask device for receiving a mask comprising a pattern;
a substrate device for receiving a substrate;
an immersion liquid; and
a projection device comprising a holding device, a plurality of optical elements and a thermal attenuation device, the optical imaging device being configured so that during operation the plurality of optical elements projects the pattern onto the substrate and the thermal attenuation device reduces fluctuations in a temperature distribution of an immersion element of the plurality of optical elements induced by the immersion liquid,
wherein the immersion element is held by the holding device, the immersion element being the optical element closest to the substrate, the immersion liquid being located between the immersion element and the substrate, the immersion element comprising a first area and a second area where the first area is optically used during operation of the optical imaging device and the second area is optically unused during operation of the optical imaging device, the second area comprising a first section adjacent the immersion liquid during operation of the optical imaging device and a second section non-adjacent to the immersion liquid during operation of the optical imaging device, and
the thermal attenuation device comprises a shielding which is a thermal decoupling device that thermally shields the holding device and at least a part of the second section of the second area of the immersion element.

43. The optical imaging device of claim 42, wherein a portion of the immersion element is between the holding device and the immersion liquid.

44. The optical imaging device according to claim 42, wherein the first shielding is between the immersion liquid and the first section of the second area of the immersion element.

45. The optical imaging device according to claim 42, wherein the first shielding contacts the first section of the second area of the immersion element.

46. An optical imaging device, comprising:
- a mask device for receiving a mask comprising a pattern;
- a substrate device for receiving a substrate;
- an immersion liquid; and
- a projection device comprising a plurality of optical elements and a thermal attenuation device, the optical imaging device being configured so that during operation the plurality of optical elements projects the pattern onto the substrate and the thermal attenuation device reduces fluctuations in a temperature distribution of an immersion element of the plurality of optical elements induced by the immersion liquid,
- wherein the immersion element is the optical element closest to the substrate and adjacent to the immersion liquid so that the immersion liquid is located between the immersion element and the substrate, the immersion element comprising a first area and a second area where the first area is optically used during operation of the optical imaging device and the second area is optically unused during operation of the optical imaging device, the second area comprising a first section adjacent the immersion liquid during operation of the optical imaging device and a second section non-adjacent to the immersion liquid during operation of the optical imaging device, and
- wherein the thermal attenuation device comprises a first shielding which is a thermal decoupling device that contacts a surface of the immersion element over at least a part of the first section of the second area of the immersion element and thermally shields this contacted part.

47. The optical imaging device according to claim 46, wherein the first shielding is between the immersion liquid and the first section of the second area of the immersion element.

48. The optical imaging device according to claim 46, wherein the first shielding contacts the first section of the second area of the immersion element.

* * * * *

UNITED STATES PATENT AND TRADEMARK OFFICE
CERTIFICATE OF CORRECTION

| | | |
|---|---|---|
| PATENT NO. | : 8,363,206 B2 | Page 1 of 1 |
| APPLICATION NO. | : 12/267074 | |
| DATED | : January 29, 2013 | |
| INVENTOR(S) | : Bernhard Gellrich et al. | |

It is certified that error appears in the above-identified patent and that said Letters Patent is hereby corrected as shown below:

Column 1,
Line 11, delete "Internation" and insert --International--

Column 4,
Line 36, delete "an an" and insert --an--

Column 4,
Line 39, delete "an an" and insert --an--

Column 6,
Line 63, delete "the" and insert --The--

Column 15,
Line 54, delete "515.1" and insert --515.1.--

Column 18,
Line 43, delete "it" and insert --It--

Column 21,
Line 67, delete "the during" and insert --during--

Signed and Sealed this
Second Day of April, 2013

Teresa Stanek Rea
*Acting Director of the United States Patent and Trademark Office*